(12) United States Patent
Brayton et al.

(10) Patent No.: US 7,133,794 B1
(45) Date of Patent: Nov. 7, 2006

(54) SIMULATOR CART

(75) Inventors: D. Dwight Brayton, Richland, WA (US); Stephen G. Romero, Richland, WA (US); Christopher S. Ghormley, Berkley, CA (US); Mark E. Dallas, Valdez, AK (US)

(73) Assignee: Flour Technologies Corporation, Aliso Viejo, CA (US)

( * ) Notice: Subject to any disclaimer, the term of this patent is extended or adjusted under 35 U.S.C. 154(b) by 228 days.

(21) Appl. No.: 10/968,341

(22) Filed: Oct. 18, 2004

Related U.S. Application Data

(62) Division of application No. 09/936,080, filed as application No. PCT/US00/07962 on Mar. 23, 2000, now Pat. No. 6,904,380.

(60) Provisional application No. 60/126,060, filed on Mar. 25, 1999.

(51) Int. Cl.
*G01D 3/00* (2006.01)
*G01M 19/00* (2006.01)

(52) U.S. Cl. ............... 702/108; 702/183; 700/108

(58) Field of Classification Search ............ 702/33, 702/57–59, 81–85, 90, 91, 108, 113–123, 702/182–185, 187; 703/20, 21, 24; 434/72, 434/81, 219; 700/21, 79, 108, 292
See application file for complete search history.

(56) References Cited

U.S. PATENT DOCUMENTS 5,079,731 A * 1/1992 Miller et al. .................. 703/6

FOREIGN PATENT DOCUMENTS

JP          09330118 A  * 12/1997

* cited by examiner

*Primary Examiner*—Marc S. Hoff
*Assistant Examiner*—Manuel L Barbee
(74) *Attorney, Agent, or Firm*—Rutan & Tucker, LLP

(57) ABSTRACT

Methods and apparatus are provided which allow control systems to be tested. Specifically, a test system is coupled to a control system in a manner which allows the test system to communicate with and drive the control system by sending and receiving signals via both the controller-I/O communication channel and the field I/O connectors. In essence, the test system is used to both simulate a plant to be controlled and to monitor, validate, and or modify the internal state of the control system controller and possibly the control system I/O interface. Plant simulation is accomplished by simulating the I/O devices to which the control system is coupled (and hence the plant processes) when installed in its operational environment. In addition to the simulation of I/O devices, the test system takes advantage of the fact that many commonly used controller and I/O interfaces are capable of communication with other devices by using such communications ability to provide instructions to or obtain information from a control system's controller(s) and I/O interface(s).

5 Claims, 62 Drawing Sheets

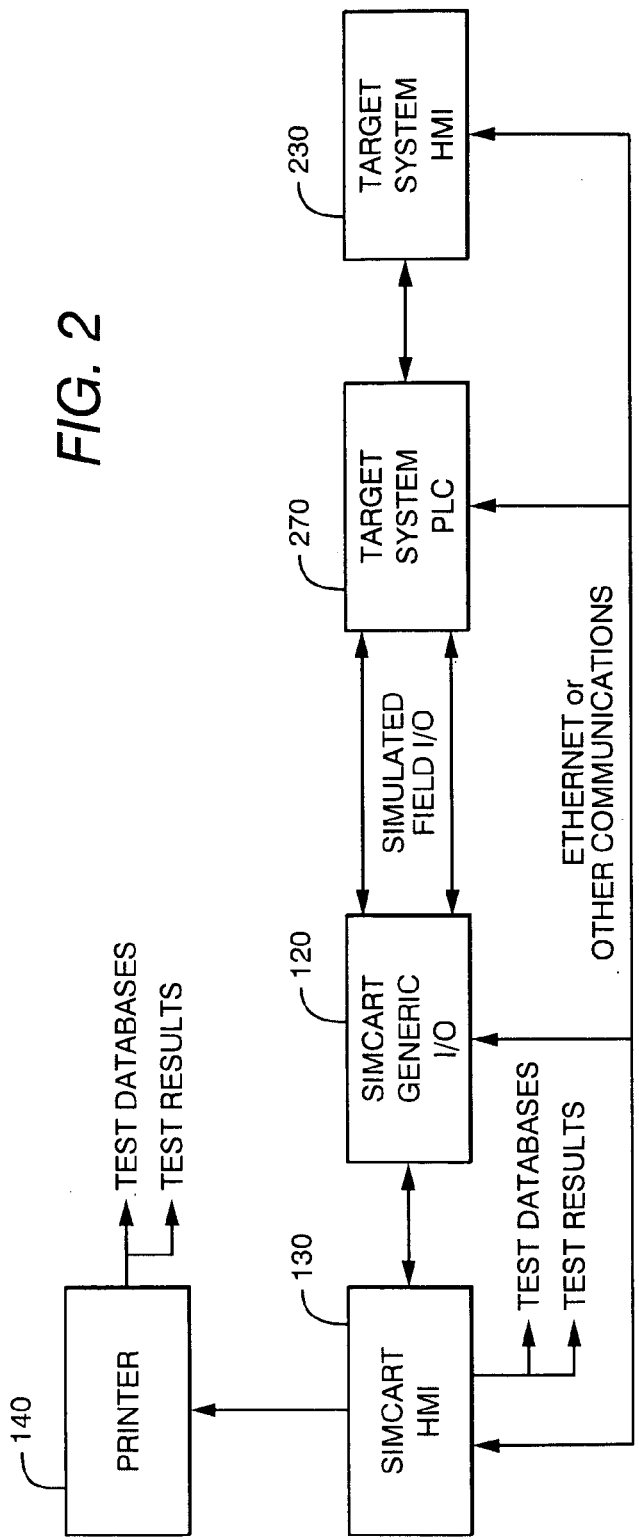

| FIG. 4A-1 | FIG. 4A-2 | FIG. 4A-3 | FIG. 4A-4 |
|---|---|---|---|
| FIG. 4A-5 | FIG. 4A-6 | FIG. 4A-7 | FIG. 4A-8 |

| FIG. 4B-1 | FIG. 4B-2 | FIG. 4B-3 | FIG. 4B-4 |
|---|---|---|---|
| FIG. 4B-5 | FIG. 4B-6 | FIG. 4B-7 | FIG. 4B-8 |

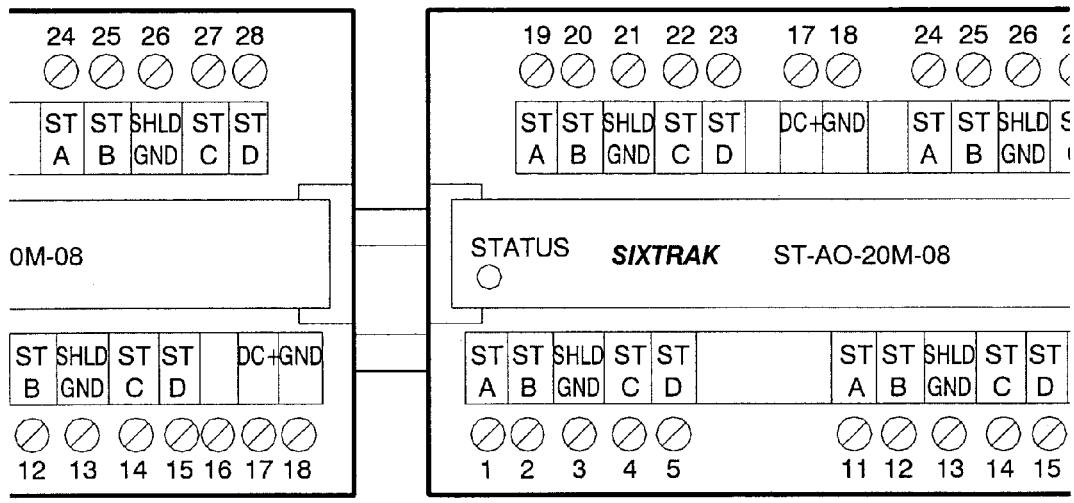
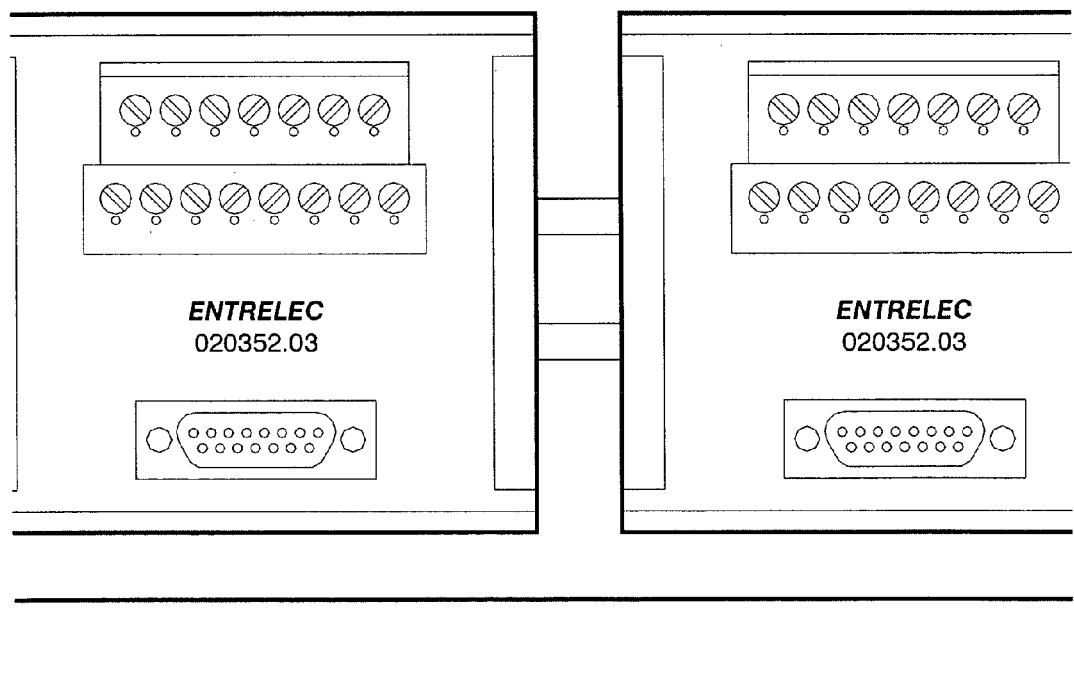
FIG. 4A-6

*FIG. 4B-2*

| MODULE 1 | MODULE 2 | MODULE 3 | MODULE 4 | MODULI |
|---|---|---|---|---|
| AI (4-20mA) 1746-NI4 | AI (4-20mA) 1746-NI4 | AI/AO (4-20mA) 1746-NIO4I | AI (4-20mA) 1746-NI4 | AI (4-20mA 1746-NI4 |

FIG. 4B-3

| ≡ 5 | MODULE 6 | MODULE 7 | MODULE 8 | MODULE 9 | MODL |
|---|---|---|---|---|---|
| ı) | AI/AO (0-5V) 1746-NIO4V | DI/DO (RELAY) 1746-IO12 | DI/DO (RELAY) 1746-IO12 | DI/DO (RELAY) 1746-IO12 | AI/AO (0 1746-NI( |

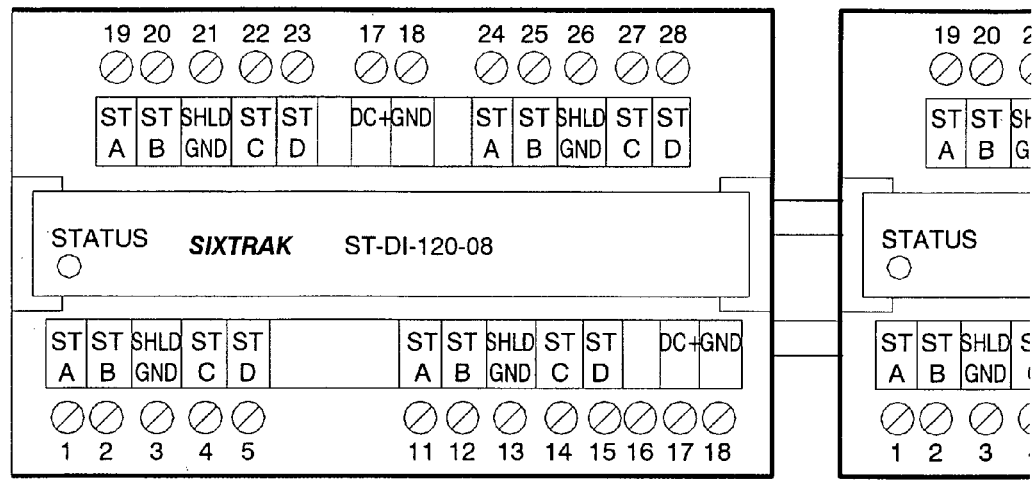
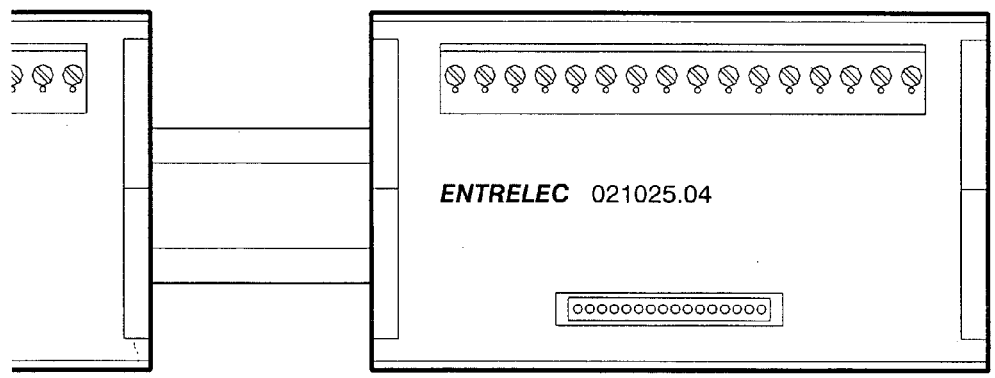
FIG. 4B-7

| FIG. 5A-1 | FIG. 5A-2 | FIG. 5A-3 | FIG. 5A-5 |
|---|---|---|---|
| FIG. 5A-5 | FIG. 5A-6 | FIG. 5A-7 | FIG. 5A-8 |

| FIG. 5B-1 | FIG. 5B-2 | FIG. 5B-3 | FIG. 5B-5 |
|---|---|---|---|
| FIG. 5B-5 | FIG. 5B-6 | FIG. 5B-7 | FIG. 5B-8 |

CONNECT TP PLC-MDL10 (AB 1746-NI04V)
BY USING ENTRELEC CABLE 021603.25

CONNECT TP PLC-MDL10 (AB 1746-NIO4V)
BY USING ENTRELEC CABLE 021603.25

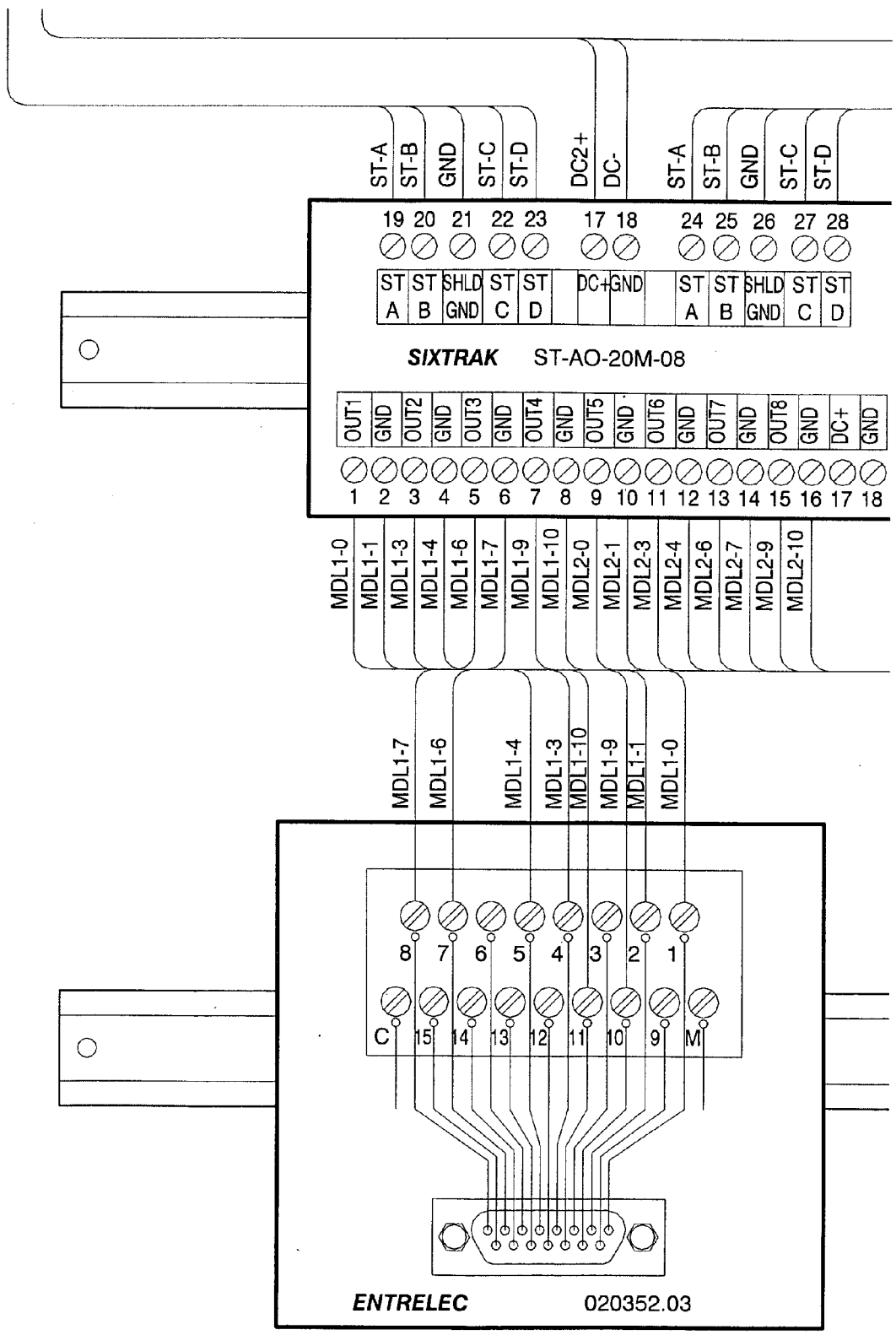
FIG. 5A-5   CONNECT TP PLC-MDL1 (AB 1746-NI4)
BY USING ENTRELEC CABLE 021603.25

CONNECT TP PLC-MDL3 (AB 1746-NIO4I)
BY USING ENTRELEC CABLE 021603.25

FIG. 5B-2

| | MODULE 1 | MODULE 2 | MODULE 3 | MODULE 4 | MODULE |
|---|---|---|---|---|---|
| 3 | AI (4-20mA) 1746-NI4 | AI (4-20mA) 1746-NI4 | AI/AO (4-20mA) 1746-NIO4I | AI (4-20mA) 1746-NI4 | AI (4-20mA 1746-NI4 |

FIG. 5B-3

| ≡ 5 | MODULE 6 | MODULE 7 | MODULE 8 | MODULE 9 | MODU |
|---|---|---|---|---|---|
| ١) | AI/AO (0-5V) 1746-NIO4V | DI/DO (RELAY) 1746-IO12 | DI/DO (RELAY) 1746-IO12 | DI/DO (RELAY) 1746-IO12 | AI/AO (0 1746-NI( |

| FIG. 6-1 | FIG. 6-2 | FIG. 6-3 | FIG. 6-5 |
|---|---|---|---|
| FIG. 6-5 | FIG. 6-6 | FIG. 6-7 | FIG. 6-8 |

| TagName | Initial | LL_Limit | L_Limit | H_Limit | HH_Limit | Deadband |
|---|---|---|---|---|---|---|
| PT_2001_01 | 1 | | | | 59.00 | |
| PT_2001_02 | 1 | | | 40.00 | 42.00 | |
| PT_2001_03 | 1 | 15.00 | | | 30.00 | |

FIG. 13

| Alm_Ind | Qnum | Type | Question |
|---|---|---|---|
| A1 | 1 | H | Did the analog display symbol flash RED on screen? |
| A1 | 1 | H_DB | Is the alarm still active? |
| A1 | 1 | H_RTN | Did the HIGH level alarm clear? |
| D1 | 1 | Dig | Did the alarm activate? |
| D1 | 1 | Dig_RTN | Did the alarm reset? |
| A1 | 1 | L | Did the analog display symbol flash RED on screen? |
| A1 | 1 | L_DB | Is the alarm still active? |
| A1 | 1 | L_RTN | Did the LOW level alarm clear? |
| A1 | 2 | H | Did the menu button for the display screen flash? |
| A1 | 2 | L | Did the menu button for the display screen flash? |
| A1 | 3 | H | Did the alarm text appear on "CURRENT ALARMS"? |
| A1 | 4 | H | Did the SCADA Alarm paging system receive the alarm? (F12 for System |

| ID | TagName | Description | EUZero | EUMax | Eunit |
|----|---------|-------------|--------|-------|-------|
| | AIT_2001_01 | Column Exit | 2 | 12 | pH |
| | AIT_2001_02 | Column Exit | 0 | 200 | mmho |
| | AIT_2001_03 | Column Inlet | 0 | 30 | AU |
| | AIT_2001_04 | Column Inlet | 0 | 30 | AU |
| | AIT_2001_05 | Column Inlet | 2 | 12 | pH |
| | AIT_2001_06 | Column Inlet | 0 | 200 | mmho |
| | PT_2001_01 | Filter Inlet | 0 | 60 | psig |
| | PT_2001_02 | Column Inlet | 0 | 60 | psig |
| | PT_2001_03 | Column Exit | 0 | 60 | psig |
| | TT_2001_01 | Feed | 0 | 50 | deg C |
| | TT_2001_02 | Column Exit | 0 | 50 | deg C |

FIG. 14

| PID_Number | Loop_Desc | Process_TagName | Min_EU | Max_EU | EU_Name | SetPoint_TagName | Control |
|------------|-----------|-----------------|--------|--------|---------|------------------|---------|
| 1 | Controls filter | dP_2001_02 | 0 | 5 | V | PT_2001_02 | dPC_20 |
| 2 | | FIT_2001_01 | 0 | 15 | L/min | FIC_2001_01SP | FIC_20 |

FIG. 15

| Num | Name |
|---|---|
| 1 | General |
| 2 | Input Manifold |
| 3 | Filtration |
| 4 | Column |
| 5 | Output |

FIG. 16A

| ID | SectionNum | SectionStep | Instruction | |
|----|------------|-------------|-------------|---|
|  | 2 | 20 | Click on "Test" button and select tag name XV_2001_105_ZCO and read | W |
|  | 2 | 21 | From HMI open valve 106. | W |
|  | 2 | 22 | Click on "Test" button and select tag name XV_2001_106_ZCO and read | W |
|  | 2 | 23 | From HMI open valve 106. | W |
|  | 2 | 24 | Click on "Test" button and select tag name XV_2001_106_ZCO and read | W |
|  | 2 | 25 | From HMI open valve 107. | W |
|  | 2 | 26 | Click on "Test" button and select tag name XV_2001_107_ZCO and read | W |
|  | 2 | 27 | From HMI close valve 107. | W |
|  | 2 | 28 | Click on "Test" button and select tag name XV_2001_107_ZCO and read | W |
|  | 2 | 29 | From HMI open valve 108. | W |
|  | 2 | 30 | Click on "Test" button and select tag name XV_2001_108_ZCO and read | W |
|  | 2 | 31 | From HMI close valve 108. | W |
|  | 2 | 32 | Click on "Test" button and select tag name XV_2001_108_ZCO and read | W |
|  | 2 | 33 | From HMI open valve 109. | W |
|  | 2 | 34 | Click on "Test" button and select tag name XV_2001_109_ZCO and read | W |
|  | 2 | 35 | From HMI close valve 109. | W |
|  | 2 | 36 | Click on "Test" button and select tag name XV_2001_109_ZCO and read | W |
|  | 2 | 37 | From HMI open valve 110. | W |
|  | 2 | 38 | Click on "Test" button and select tag name XV_2001_110_ZCO and read | W |
|  | 2 | 39 | From HMI close valve 110. | W |
|  | 1 | 1 | Instauction 1 | Q |
|  | 2 | 1 | From HMI open valve 101. | W |
|  | 2 | 2 | Click on "Test" button and select tag name XV_2001_101_ZCO and read | W |
|  | 2 | 3 | From HMI close valve101. | W |
|  | 2 | 4 | Click on "Test" button and select tag name XV_2001_101_ZCO and read | W |
|  | 2 | 5 | From HMI open valve 102. | W |

| | | |
|---|---|---|
| 2 | 6 | Click on "Test" button and select tag name XV_2001_102_ZCO and read | W |
| 2 | 7 | From HMI close valve 102. | |
| 2 | 8 | Click on "Test" button and select tag name XV_2001_102_ZCO and read | W |
| 2 | 9 | From HMI open valve 103. | |
| 2 | 10 | Click on "Test" button and select tag name XV_2001_103_ZCO and read | W |
| 2 | 11 | From HMI close valve 103. | |
| 2 | 12 | Click on "Test" button and select tag name XV_2001_103_ZCO and read | W |
| 2 | 13 | From HMI open valve 104. | |
| 2 | 14 | Click on "Test" button and select tag name XV_2001_104_ZCO and read | W |
| 2 | 15 | From HMI close valve 104. | |
| 2 | 16 | Click on "Test" button and select tag name XV_2001_104_ZCO and read | W |
| 2 | 17 | From HMI open valve 105. | |
| 2 | 18 | Click on "Test" button and select tag name XV_2001_105_ZCO and read | W |
| 2 | 19 | From HMI close valve 105. | |
| 2 | 40 | Click on "Test" button and select tag name XV_2001_110_ZCO and read | W |
| 3 | 1 | Select PID test from test module menu. Run test for FQIT_2001_01. | W |
| 3 | 2 | Select Totalizer test from test module menu. Run test for FQIT_2001_01. | W |
| 3 | 3 | Select Indication test from test module menu. Run test for FQIT_2001_01. | W |
| 3 | 4 | Select Indication test from test module menu. Run test for TT_2001_01. | W |
| 3 | 5 | Select Indication test from test module menu. Run test for PT_2001_01. | W |

| ID | Section | Requirement | Question |
|---|---|---|---|
| | G.1 | 1 | Security requirements related to hardware: |
| | G.1 | 2 | Login requirements: |
| | G.1.2 | 1 | Password protection required (Yes/No): |
| | G.1.2 | 2 | Protection areas: |
| | G.1.2 | 3 | Number of security levels: |
| | G.1.2 | 4 | Security level names: |
| | G.1.2 | 5 | Configurable levels (Yes/No): |
| | G.1.2 | 6 | What can be configured? |
| | G.1.2 | 7 | System restrictions: |
| | G.1.2 | 8 | Other login requirements: |
| | G.2 | 1 | PLC Specifications: |
| | G.2.1 | 1 | Brand of PLC used: |
| | G.2.1 | 2 | Type of PLC used: |
| | G.2.1 | 3 | PLC quantity: |
| | G.2 | 2 | Operating Conditions |
| | G.2.2 | 1 | Ambient operating temperature range: |
| | G.2.2 | 2 | Relative humidity range: |
| | G.2.2 | 3 | RFI requirements: |
| | G.2.2 | 4 | Other operating condition requirements: |
| | G.2 | 3 | Hardware Requirements: |
| | G.2.3 | 1 | Mounting requirements: |
| | G.2.3 | 2 | Control network type: |
| | G.2.3 | 3 | Access ports: |
| | G.2.3 | 4 | I/O Network port required? (Yes/No) |
| | G.2.3 | 5 | Other hardware requirements: |
| | G.2 | 4 | PLC programming software: |
| | G.2 | 5 | Electrical Specifications: |
| | G.2.5 | 1 | Power supply: |
| | G.2.5 | 2 | Electrical isolation requirements: |
| | G.2.5 | 3 | Wiring requirements: |
| | G.2.5 | 4 | Other electrical requirements: |
| | G.2 | 6 | PLC Alarms: |
| | G.2.6 | 1 | Hardware alarms: |
| | G.2.6 | 2 | Software alarms: |
| | G.2.6 | 3 | LED indications for diagnositc points required? |
| | G.2.6 | 4 | Other PLC Alarms: |
| | G.2 | 7 | Other PLC specific requirements: |
| | G.3 | 1 | PC Specifications: |
| | G.3.1 | 1 | Will a PC be used? (Yes/No) |
| | G.3.1 | 2 | PC manufacturer preference: |
| | G.3.1 | 3 | PC type (e.g., Tower, Desktop, etc.): |
| | G.3.1 | 4 | PC processor type: |
| | G.3.1 | 5 | RAM (MB) required: |
| | G.3.1 | 6 | Number of PCs required: |
| | G.3 | 2 | Laptop Specifications: |
| | G.3.2 | 1 | Will a laptop be used? (Yes/No) |

FIG. 23 providing a plant control system to be tested, the control system comprising a controller, an I/O interface, a sensor input port, an actuator output port, a series of communication segments communicatively coupling the sensor input port to the controller such that an input signal applied to the sensor input results in one or more signals traveling along each of the communication segments so as to notify the controller of the applied input signal, and a series of communication segments communicatively coupling the controller to the actuator output port such that a control signal generated by the controller results in an output signal being applied to the actuator output port — 911 providing a simulator, the simulator coupled to the control system at at least three points, wherein a first point is the sensor input port, a second point is a controller-I/O interface network access point from which data relating to the internal state of the controller can be obtained, and a third point is the actuator output port — 912 causing the simulator to apply a signal to the first point and to subsequently obtain data on the internal state of the controller and to monitor the actuator output port for any applied signals — 913

FIG. 26

941 — providing a plant control system to be tested, the control system comprising a controller, an input/output (I/O) interface in communication with the controller via a first communications channel, the I/O interface comprising a plurality of field I/O connectors; a plurality of sensors, and a plurality of actuators, wherein the plurality of sensors and the plurality of actuators are coupled to the field IO connectors via field wiring harnesses, and wherein the controller transmits signals to the actuators by transmitting a signal via the first communication channel to the I/O interface and the I/O interface transmitting a corresponding signal to the actuators via the field wiring harnesses, and the sensors send signals to the controller by sending a signal via the field wiring harnesses to the I/O interface and the I/O interface sending a corresponding signal to the controller via the first communication channel

942 — providing a simulator capable of duplicating the signals sent by the sensors to the controller and capable of receiving the signals sent by the controller to the actuators

943 — disconnecting at least some of the plurality of actuators and/or at least some of the plurality of sensors from the I/O interface

944 — coupling the simulator to the I/O interface in place of at least some of the disconnected actuators and/or sensors

945 — causing the simulator to sending signals to the controller via the I/O interface wherein the sent signals have similar characteristics to signals which the disconnected sensors could send

946 — causing the simulator to receive signals from the controller via the I/O interface wherein the received signals have similar characteristics to signals which would be received by the disconnected actuators

947 — monitoring the signals received by the simulator from the controller via the I/O interface

948 — comparing the received signals to an expected value stored in a requirements database

SIMULATOR CART

This application is a divisional of applications
Application Ser. No. 09/936,080 filed on Mar. 12, 2002 now U.S. Pat. No. 6,904,380.
International Application PCT/US00/07962 filed on Mar. 23, 2000, and which designated the U.S.
The nonprovisional application designated above, namely application PCT/US00/07962, filed Mar. 23, 2000, claims the benefit of U.S. Provisional Application No. 60/126,060 filed Mar. 25, 1999.

This application claims the benefit of U.S. provisional application No. 60/126,060 incorporated herein by reference in its entirety.

FIELD OF THE INVENTION

The field of the invention is test and simulator systems.

BACKGROUND OF THE INVENTION

Control systems incorporating PLCs (Programmable Logic Controlers) and DCSs (Distributed Control Systems) are frequently used to control real world processes by accepting inputs which typically originate from sensors such as, among others, those used to sense temperature, flow, level, radiation, light, movement, and pressure, and those used in generating outputs which are used to drive actuators such as hydraulic devices, valves, lights, and motors. Control systems can often be viewed as having a control component and an interface component, with one or both components having both hardware and software sub-components. Thus a PLC based device might utilize a digital PLC having embedded software as the control component (the "controller"), with an interface component (the "I/O interface") (a) accepting signals from sensors and converting them into a form acceptable to the PLC, and (b) accepting outputs from the PLC and converting them to signals suitable as inputs to the actuators. In such systems, the controller and I/O interface are often connected by one or more paths (the "controller-I/O communication channel") to allow communication and control signals to pass between the controller and the I/O interface. Similarly, the I/O interface is, after the control system is installed in its operating environment, connected via one or more electrical paths (the "field wiring") to the components from which the control system receives its inputs, and to the components to which the control system directs its outputs, with the I/O interface being provided with a plurality of connectors ("field I/O connectors") which facilitate connecting the I/O interface with the field wiring. Many control systems will also incorporate a human-machine-interface (HMI) component comprising hardware and or software for facilitating operator interaction with the control system.

Although methods and devices for testing control systems are known, they generally have individual strengths and weaknesses which make them more appropriate in some situations and less appropriate in other. Thus, there is a continuing need for improved methods and apparatus for control system testing.

SUMMARY OF THE INVENTION

Methods and apparatus are provided which allow control systems to be tested. Specifically, a test system is coupled to a control system in a manner which allows the test system to communicate with and drive the control system by sending and receiving signals via both the controller-I/O communication channel and the field I/O connectors. In essence, the test system is used to both simulate a plant to be controlled and to monitor, validate, and or modify the internal state of the control system controller and possibly the control system I/O interface. Plant simulation is accomplished by simulating the I/O devices to which the control system is coupled (and hence the plant processes) when installed in its operational environment. In addition to the simulation of I/O devices, the test system takes advantage of the fact that many commonly used controller and I/O interfaces are capable of communication with other devices by using such communications ability to provide instructions to or obtain information from a control system's controller(s) and I/O interface(s).

It is contemplated that the methods and apparatus disclosed herein will provide an effective approach to connecting a control system to be tested to simulated I/O devices and controlling and monitoring the simulated I/O devices so as to produce inputs to the control system, to record outputs from the control system, and to compare the recorded outputs against an expected value and record the result of the comparison for reporting purposes.

It is also contemplated that the methods and apparatus disclosed herein will provide an effective approach to the staging and testing of PLC/HMIs (Programmable Logic Controllers/Human Machine Interfaces) and DCSs (Distributed Control Systems) before delivery to the field.

It is also contemplated that the methods and apparatus disclosed herein will provide an effective mechanism for validating the operation of a control system once it has been installed in a plant to be controlled.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 12 is a diagram of a simulator HMI database table.
FIG. 13 is a diagram of a simulator HMI database table.
FIG. 14 is a diagram of a simulator HMI database table.
FIG. 15 is a diagram of a simulator HMI database table.
FIG. 18 is a diagram of a simulator HMI database table.
FIG. 23 is a diagram of a fifth method embodying the invention.
FIG. 26 is a diagram of an eighth method embodying the invention.

DETAILED DESCRIPTION

Figure 1:
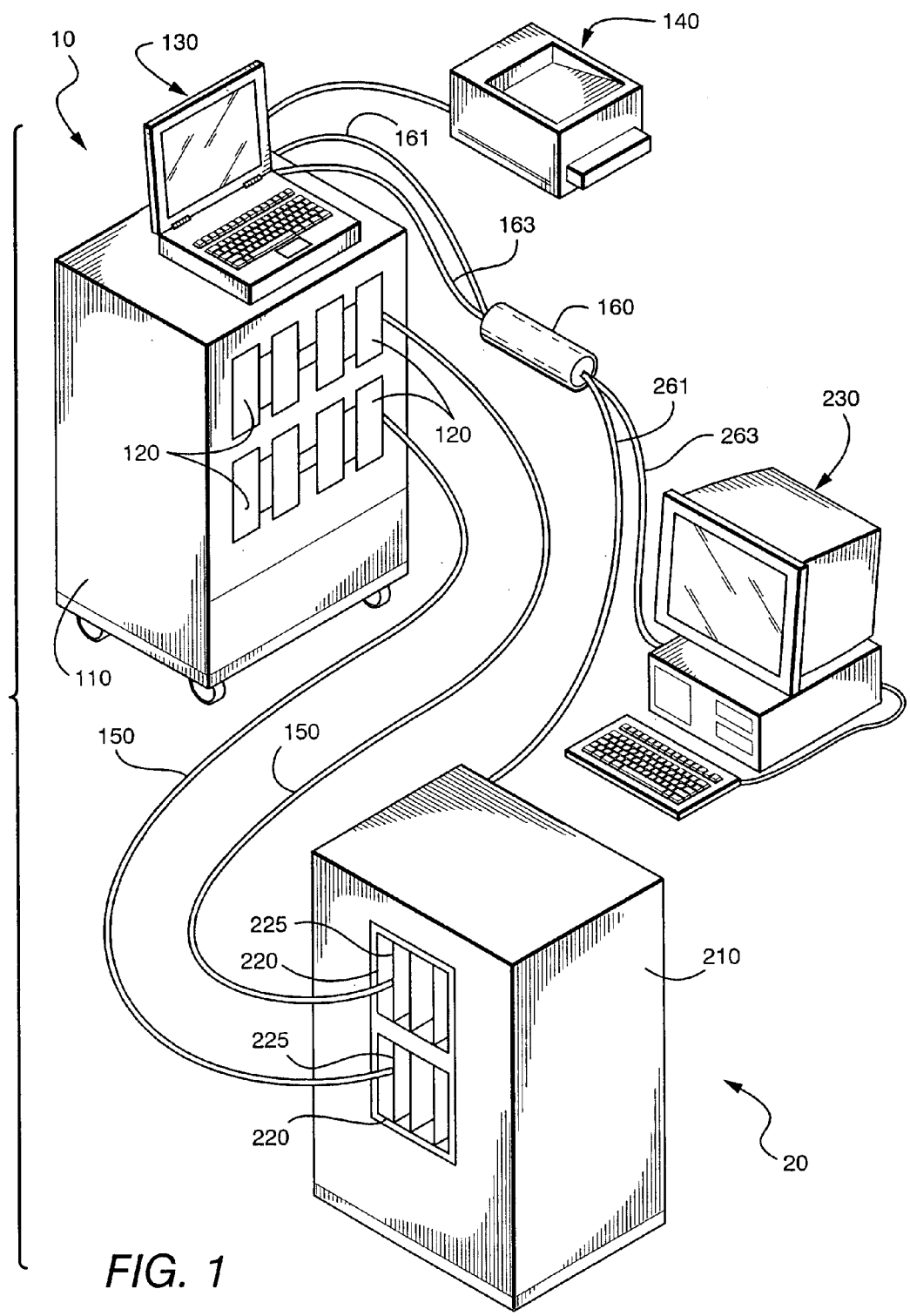
FIG. 1 is a schematic view of a simulator cart embodying the invention.
Figure 3:
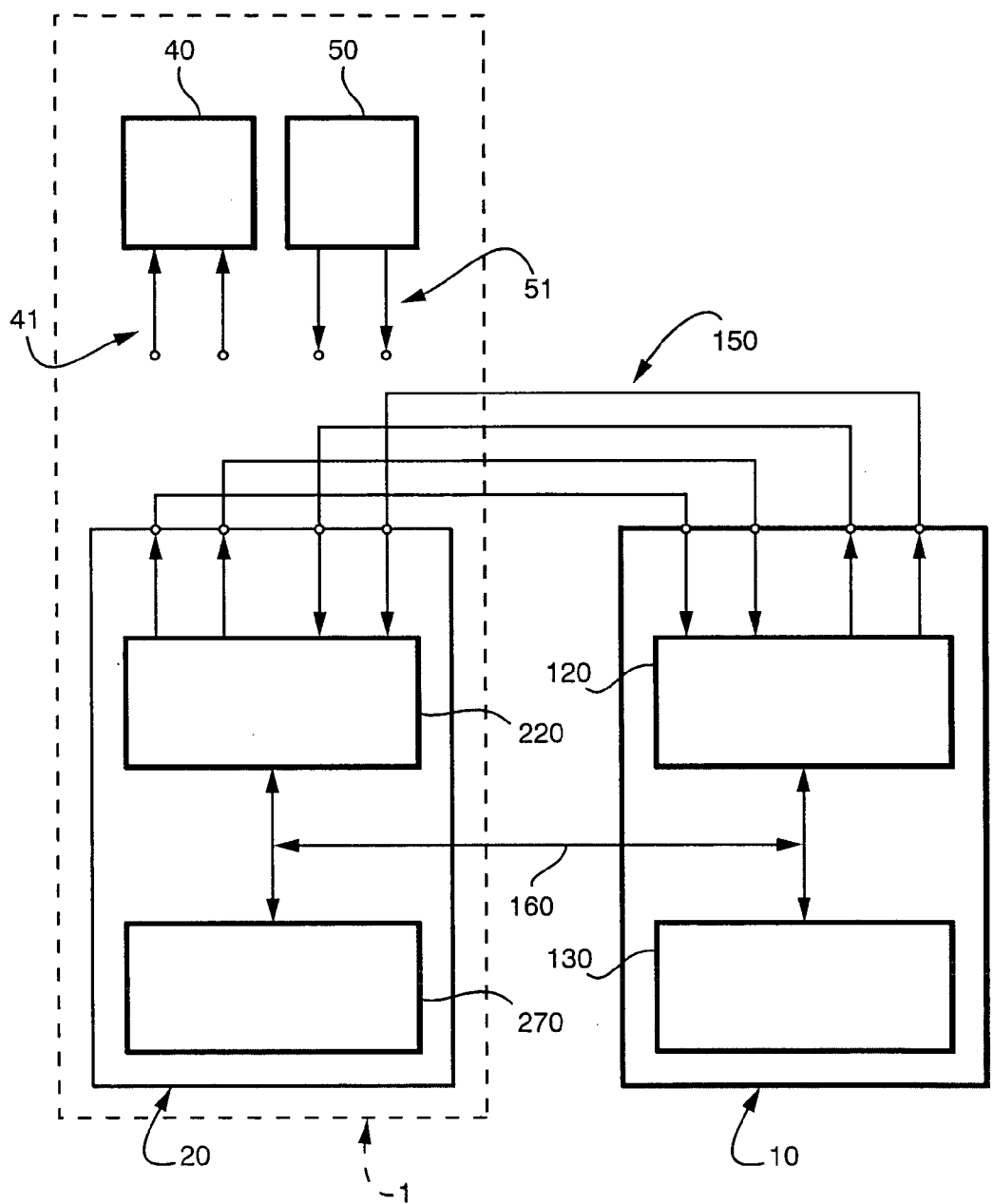
FIG. 3 is a schematic view of a simulator coupled to a plant control system.
Figure 2:
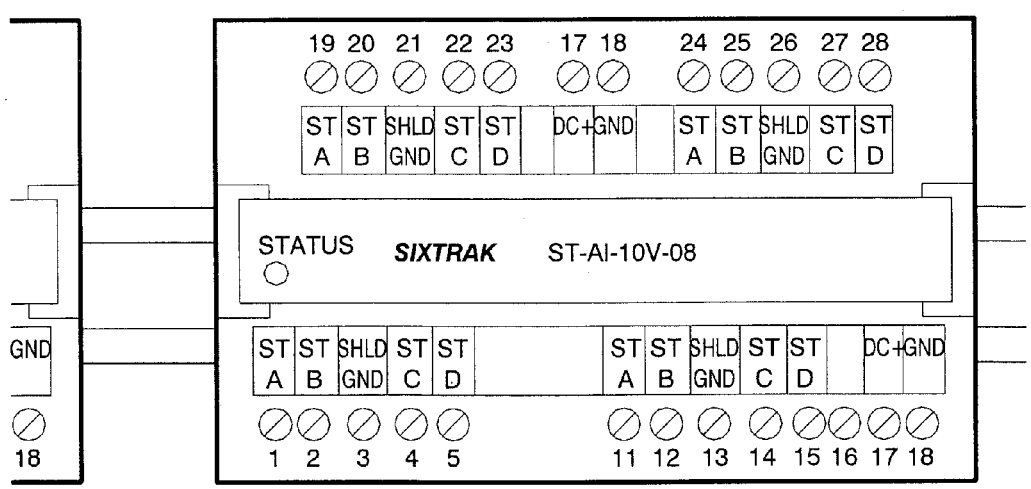
FIG. 2 is an alternative schematic view of the simulator cart of FIG. 1.
Figure 3:
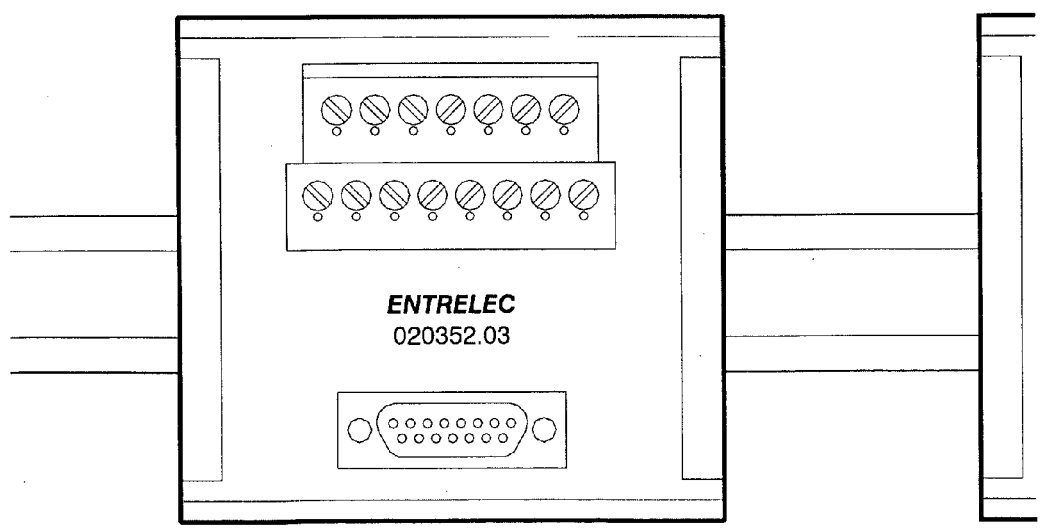

Referring to FIGS. 1–3, a simulator cart test system ("SIMCart") 10 is coupled to a control system to be tested ("target CS") 20. SIMCart 10 includes rolling enclosure 110, I/O simulator modules 120, HMI/configurator 130, hardcopy device 140, wiring harnesses 150, and communication channel 160 connections 161 and 163. Target CS 20 includes enclosure 210, I/O interfaces 220, field I/O connectors 225, HMI 230, communication channel 160 connections 261 and 263, and PLC 270. SIMCart 10 uses wiring harnesses 150 to send and receive I/O signals to and from I/O interfaces 220 so as to simulate the input devices/sensor 50 and output devices/actuators 40 which would be connected via the field wiring 41 and 51 to target CS 20 when target CS 20 is installed. SIMCart 10 uses communications channel 160 to obtain register and status information from I/O interfaces 220, HMI 130 and PLC 270. By monitoring the internal state of and data flow between I/O interfaces 220, HMI 130 and PLC 270, SIMCart 10 is better able to isolate any problems which may occur in target CS 20 during testing as occurring in a particular subsystem of target CS 20. The manner in which SIMCart 10 is coupled to target CS 20 also permits SIMCart 10 to test multiple I/O channels and or subsystems of target CS 20 simultaneously.

The SIMCart is automatically initialized by utilizing communications channel 160 to query target CS 20 to obtain information which allows SIMCart 10 to perform automatic initialization and mapping of its input and outputs to those of target CS 20. SIMCart 10 incorporates a knowledge base which includes characteristics of known control system hardware and software components in performing such automatic initialization. It is contemplated that the knowledge base might be extended to include mathematical models of standard components such as sensors and actuators to allow SIMCart 10 to better simulate such components and to allow automatic test generation for target systems which will be coupled to such components. FIGS. 12–18 show some of the fields and data which might be used in maintaining such a knowledge base.

SIMCart 10 is contemplated as being beneficial in the development and off-site testing of target CS 20 by simulating the plant which target CS 20 is intended to control. If the capacity of a single SIMCart 10 is insufficient to simulate an entire plant, multiple SIMCarts 10 can be used to achieve the simulation. Such a combination of SIMCarts 10 may utilize multiple HMI 130 devices, or may share a single HMI 130. SIMCart 10 is also contemplated as being beneficial for off-site training of personnel in the operation of target CS 20 when SIMCart 10 is used in conjunction with target CS 20. Such off-site use of SIMCart 10 is contemplated as providing, among others, complete testing of all target CS 20 inputs and resulting outputs before field installation On-site testing is also contemplated as benefiting from the use of SIMCart 10, either in its entirety or only its configurator/HMI portion. Once target CS 20 is installed in its operational environment, configurator 130 can be used as a test and validation tool. The configurator 130 can provide step-by step instructions to a field tester which, if followed, result in a desired level of testing of target CS 20. By doing so, configurator 130 essentially controls the test process through the field tester. By requiring feedback from the field tester upon the completion of various portions of the testing, a test report which includes the tests steps performed and the tester responses can be generated so as to provide assurance that the required level of testing has be completed. Such "controlled" testing thus provides a method of repeatable, validated and verified testing. Configurator 130 can also be used to record the results of such testing and to generate reports in the field which provide feedback as to the current state of target CS 20 and the field wiring to which target CS 20 is coupled.

If the entire SIMCart 10 is used on-site, SIMCart 10 can be interchanged with selected inputs and outputs of target CS 20 so as to allow "live" inputs to cause target CS 20 to control simulated actuator components, or to use simulated inputs to cause target CS 20 to control "live" actuator components, or to mix and match live and simulated inputs and outputs as desired. If configurator 130 is still attached to the rest of SIMCart 10 during testing, and if SIMCart 10 is coupled to target CS 20 during testing, configurator 130 can control the test process both through direct interaction with target CS 20 and through a test operator as previously discussed.

Rolling enclosure 110 of SIMCart 10 is preferred to be sized and dimensioned to house I/O simulator modules 120 and any necessary supporting systems in a manner which facilitates the use of SIMCart 10 and its interconnection with target CS 20.

Figures 1, 4A:
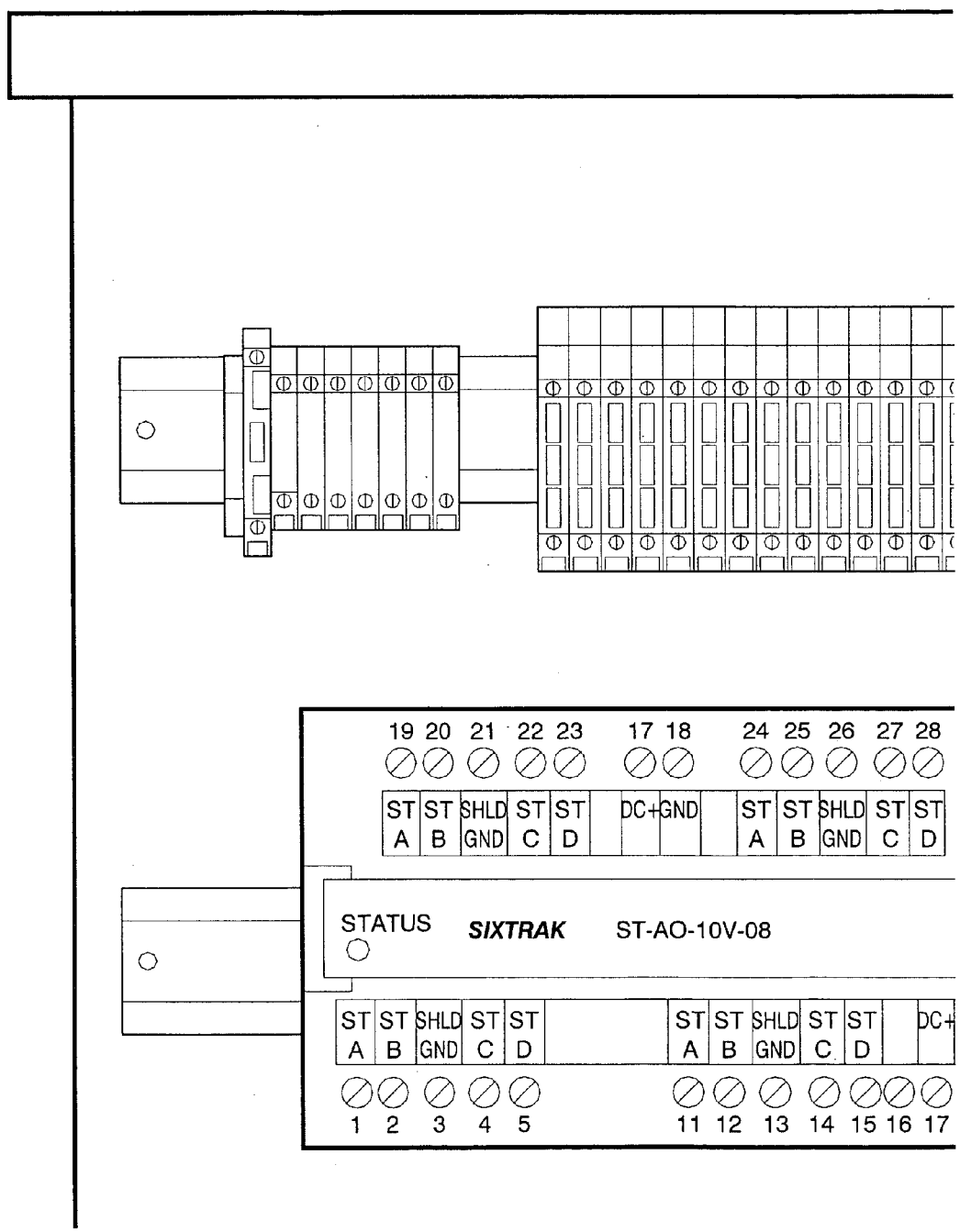
FIG. 4A is a diagram of a preferred layout for components on a first side of a cart based simulator.
Figure 4A:
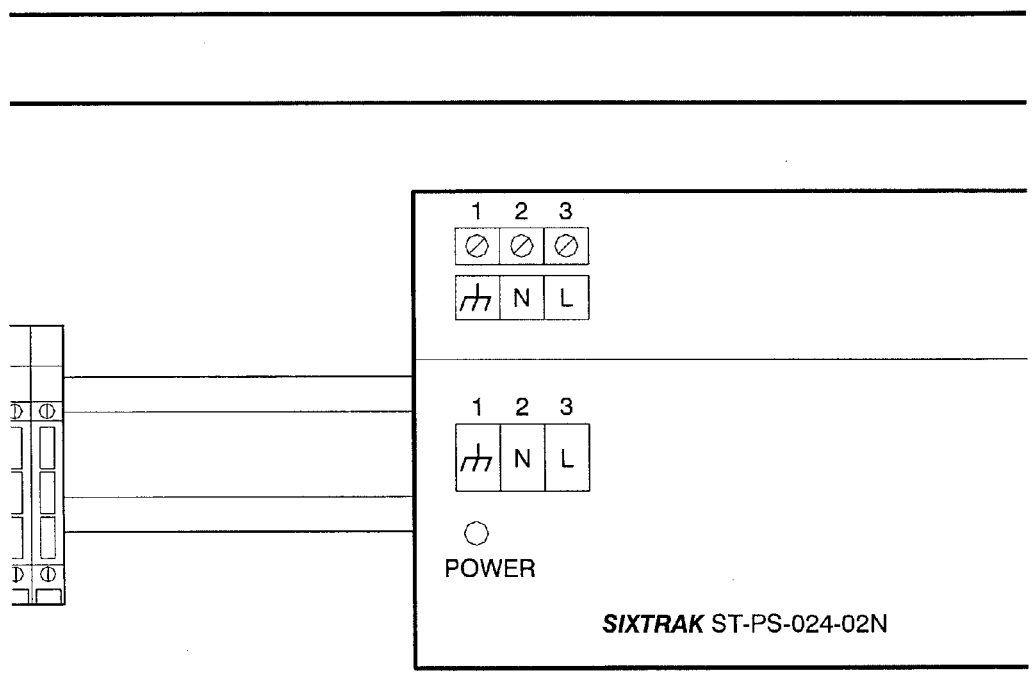
Figure 4A:
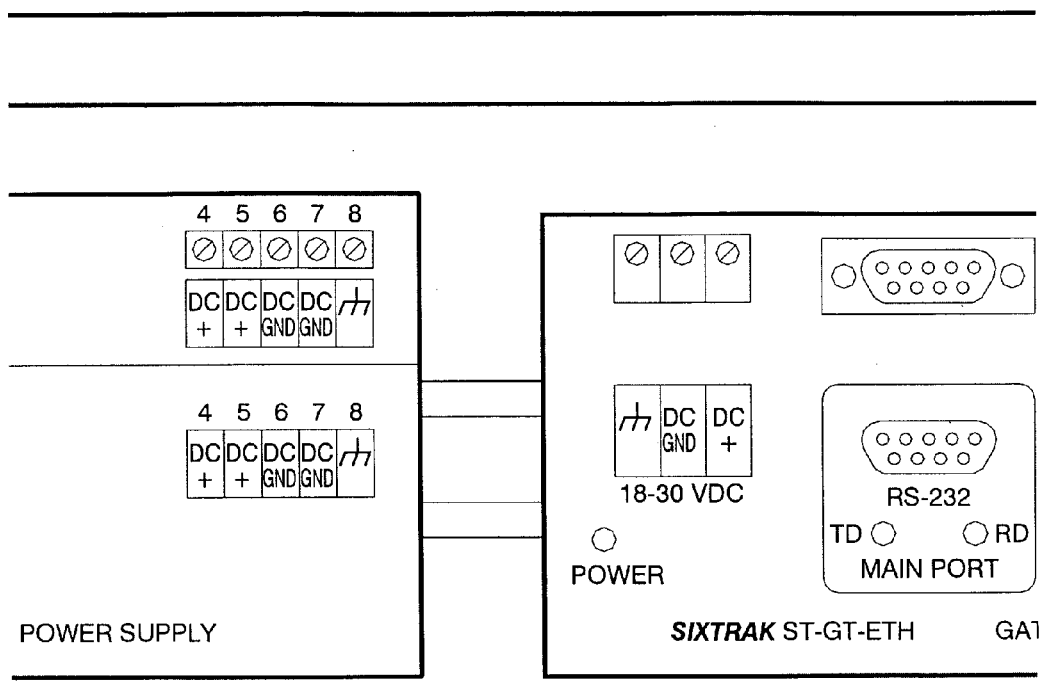
Figures 4, 4A:
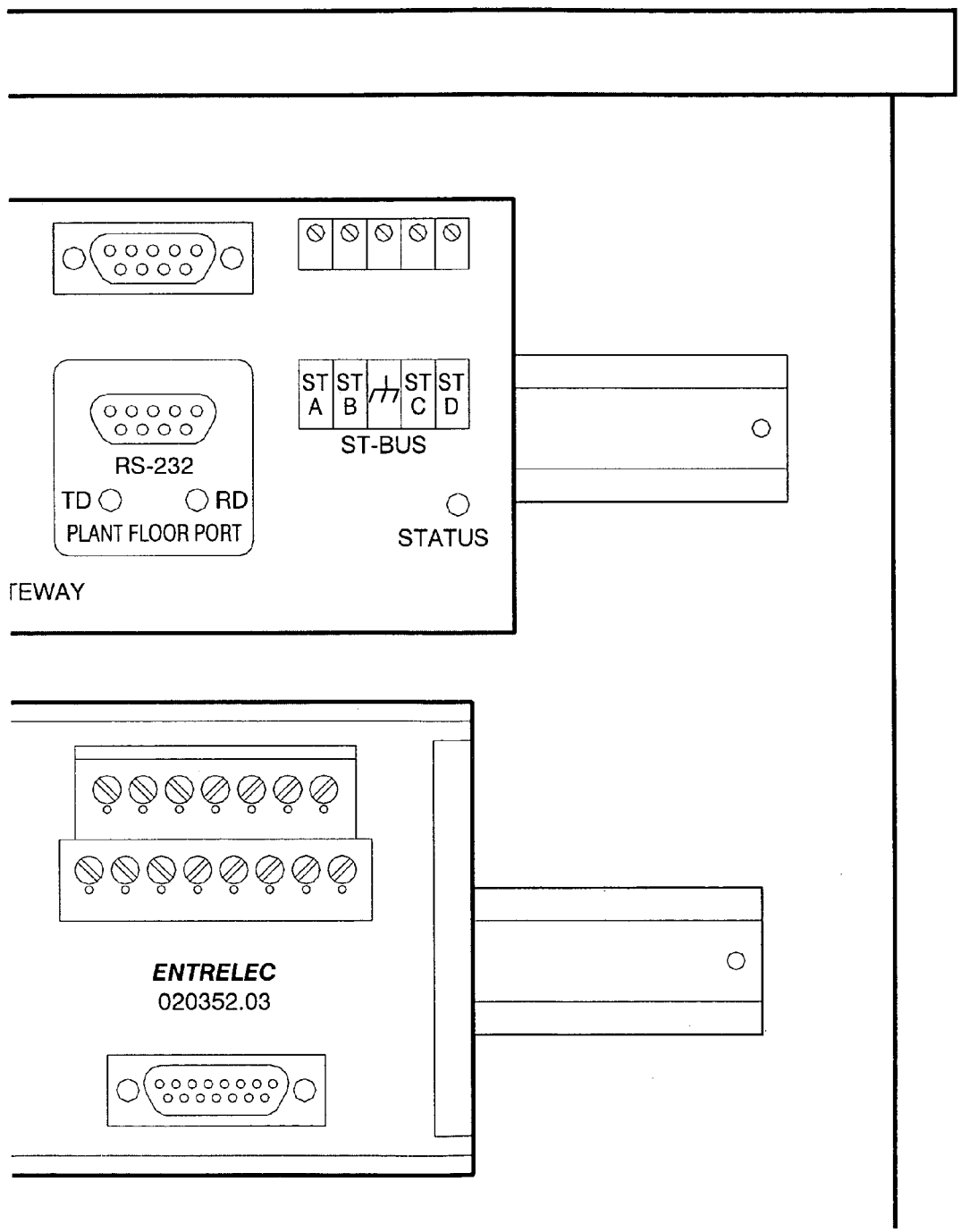
Figures 4, 4A, 5:
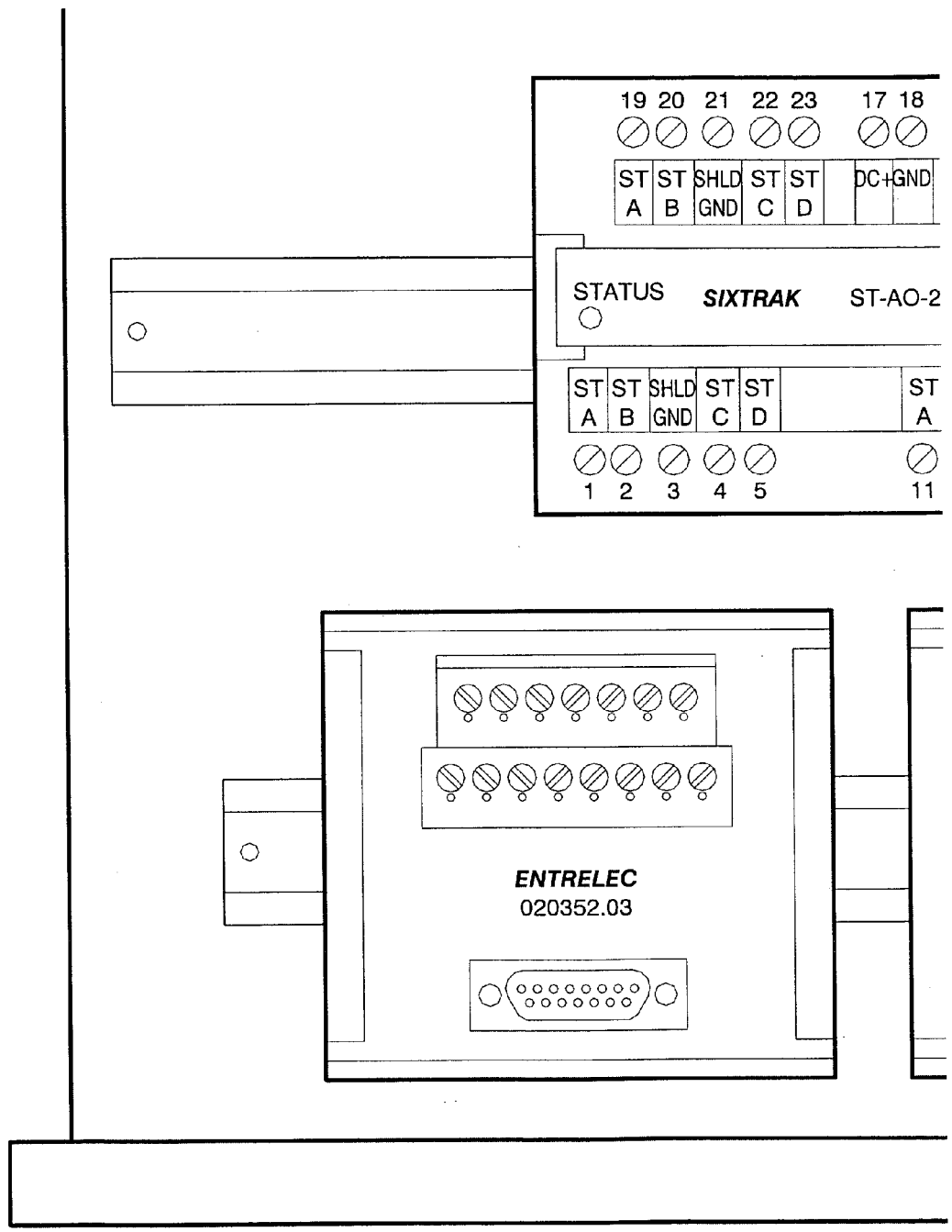
Figures 4, 4A, 5, 6, 7:
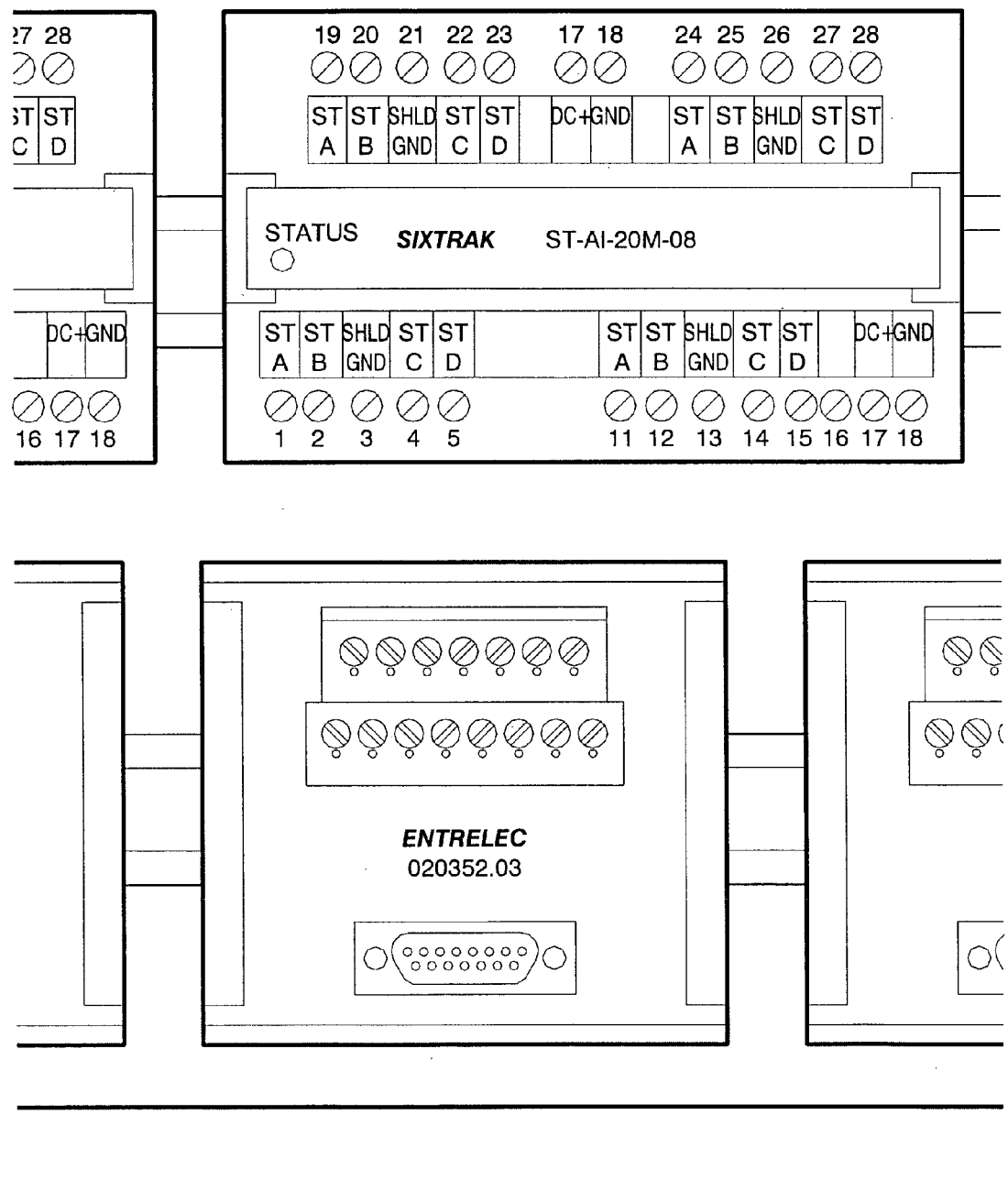
FIG. 6 is a diagram of a preferred layout for components in a "briefcase" based simulator.
FIG. 7 is a screen capture of a simulator HMI screen wherein an operator is being prompted to select which test section to run.
Figures 4, 4A, 5, 6, 7, 8:
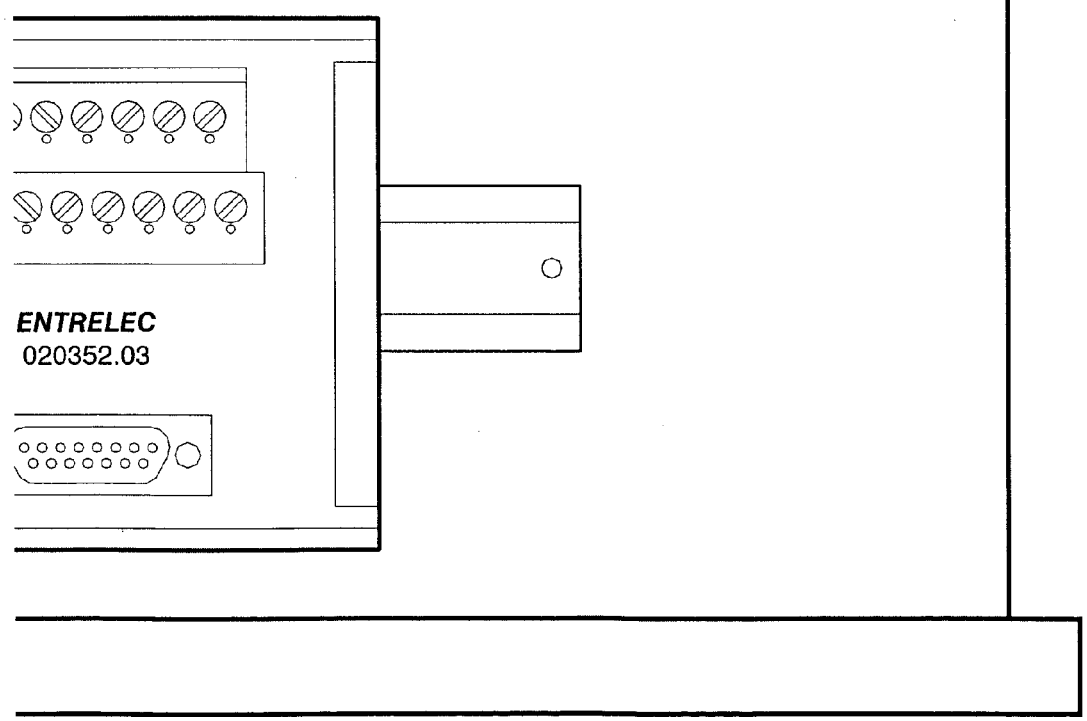
FIG. 8 is a screen capture of a simulator HMI screen wherein an operator is being prompted to select whether to run a particular test or an entire test procedure.
Figures 1, 4B:
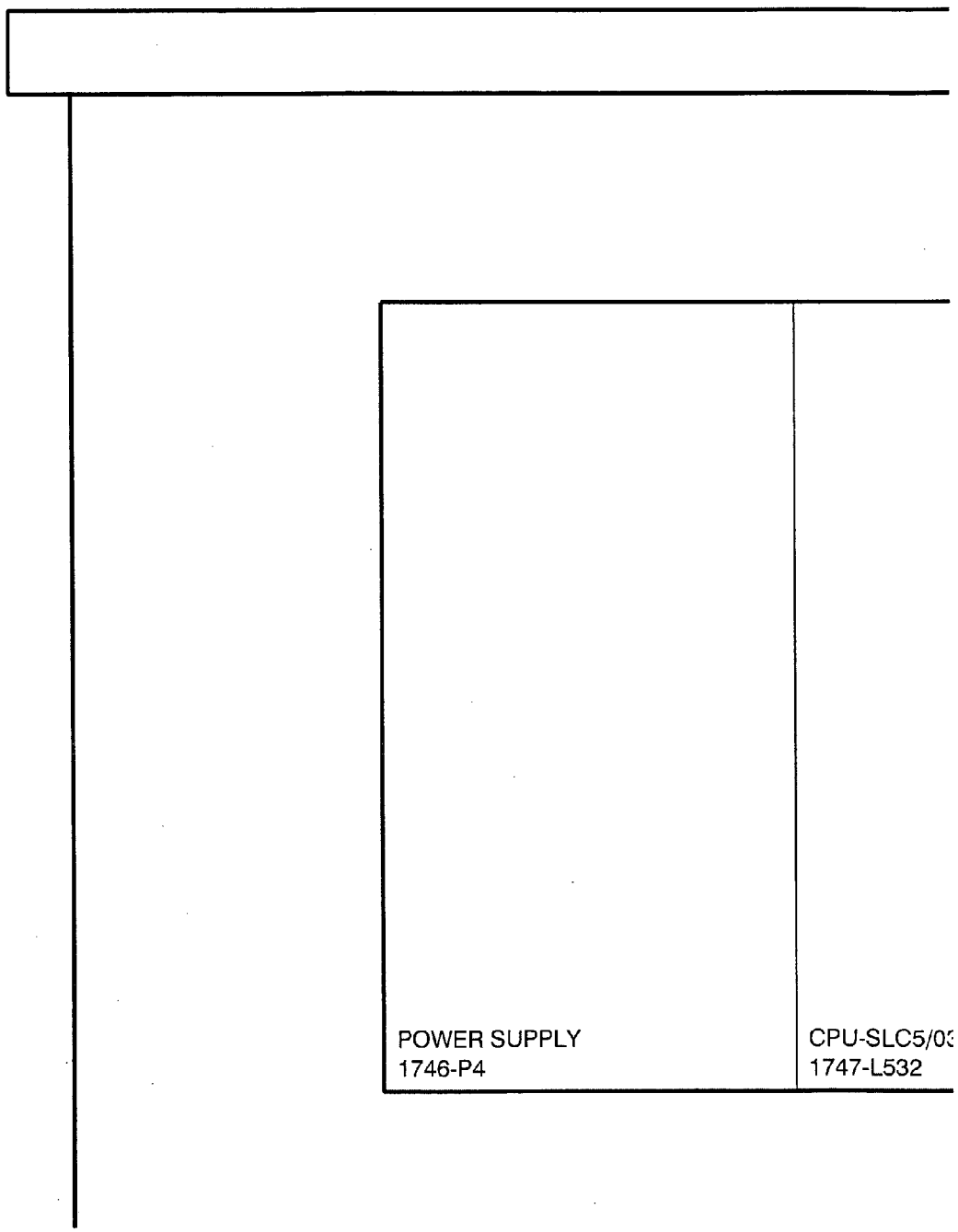
FIG. 4B is a diagram of a preferred layout for components on a second side of the simulator of FIG. 4a FIG. 5A is a wiring diagram illustrating a preferred method of interconnection for the components of the simulator of FIG. 4A.
Figures 4, 4B:
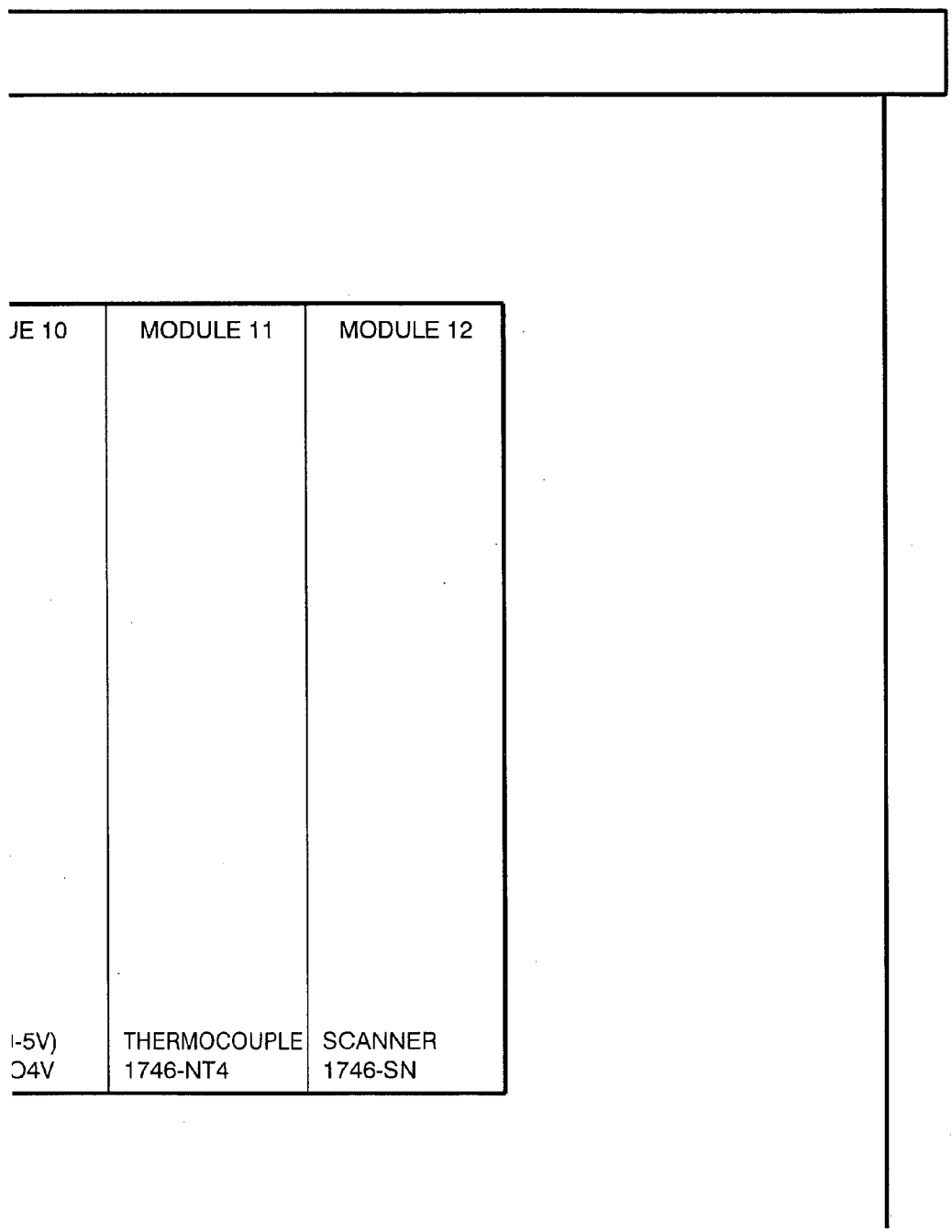
Figures 4, 4B, 5:
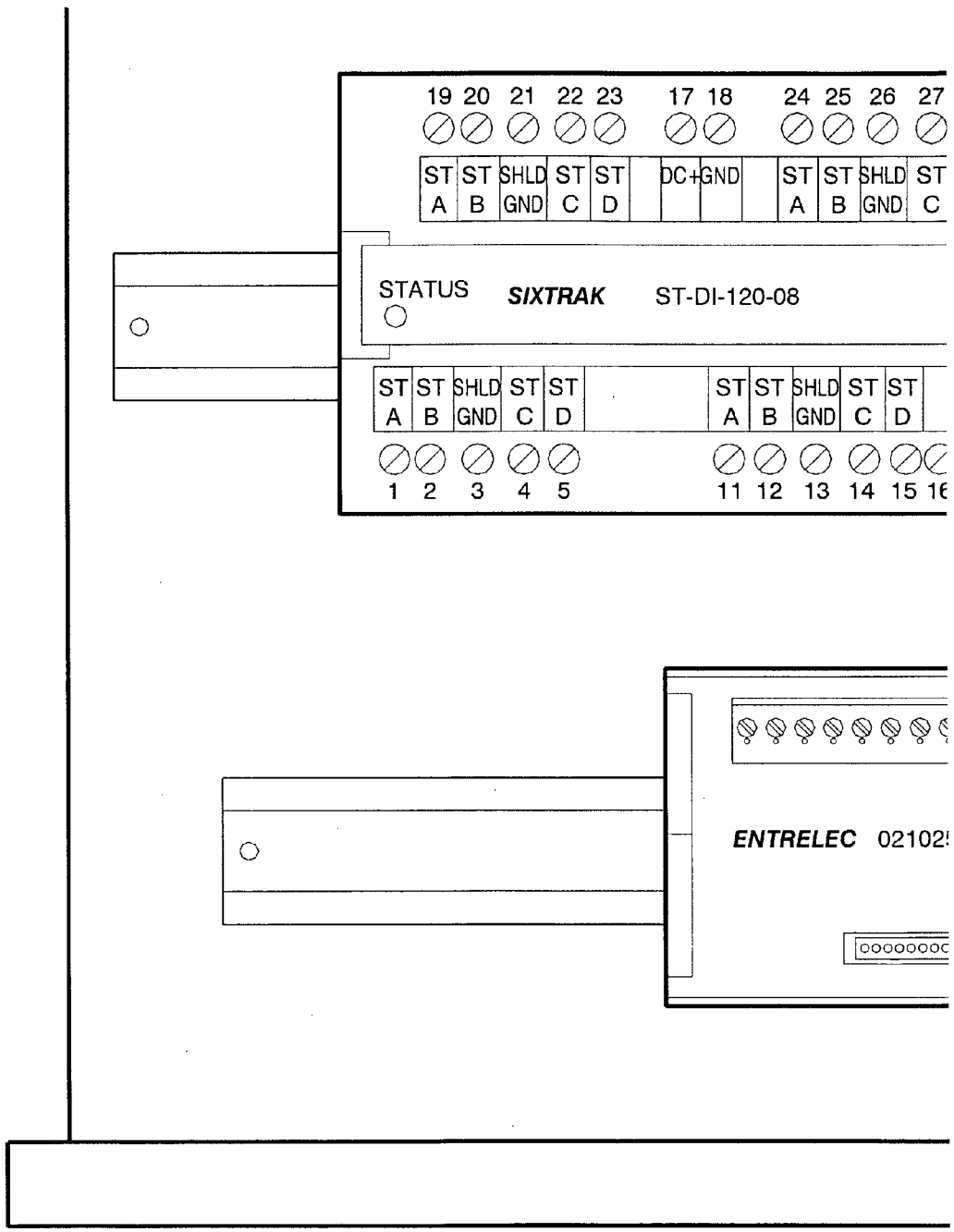
Figures 4, 4B, 5, 6:
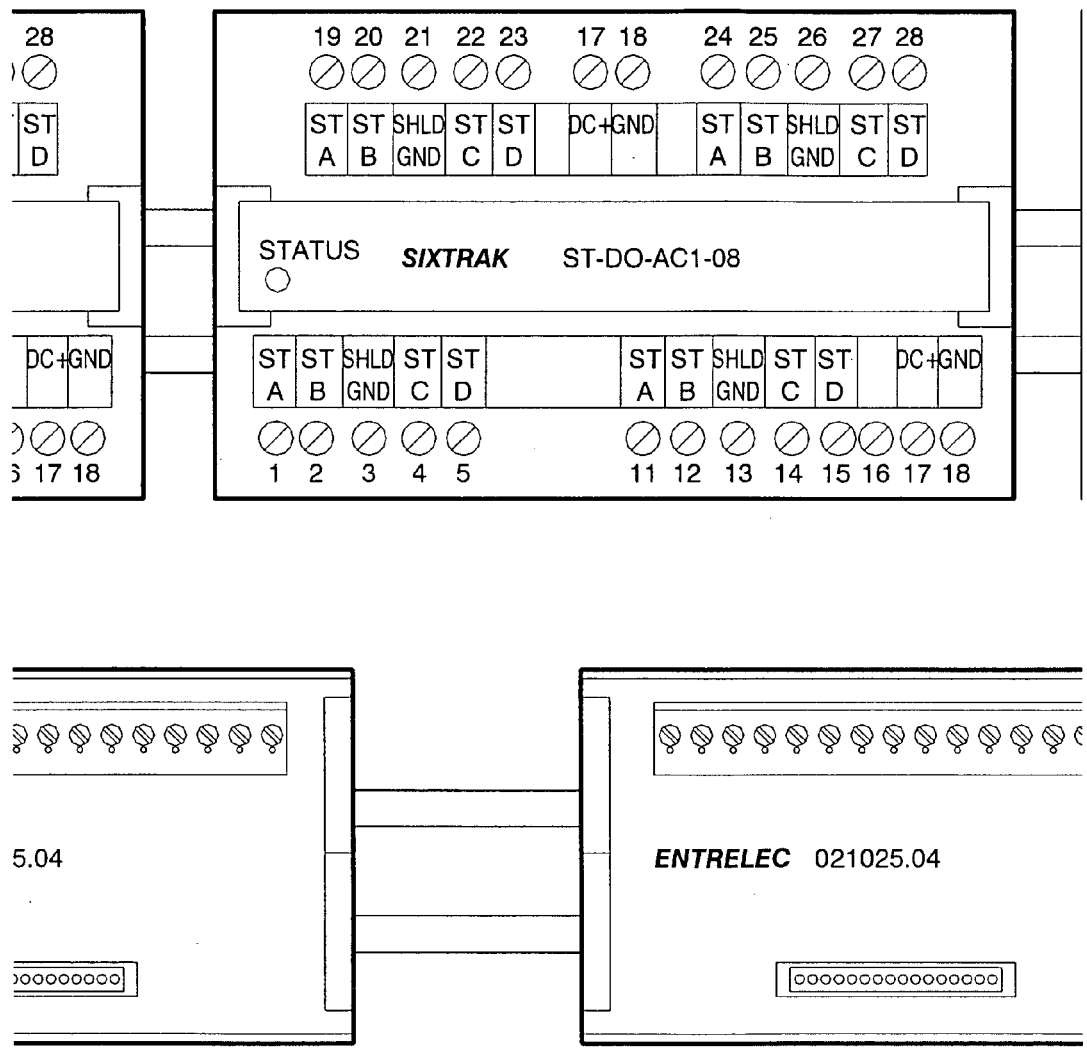
Figures 4, 4B, 5, 6, 7, 8:
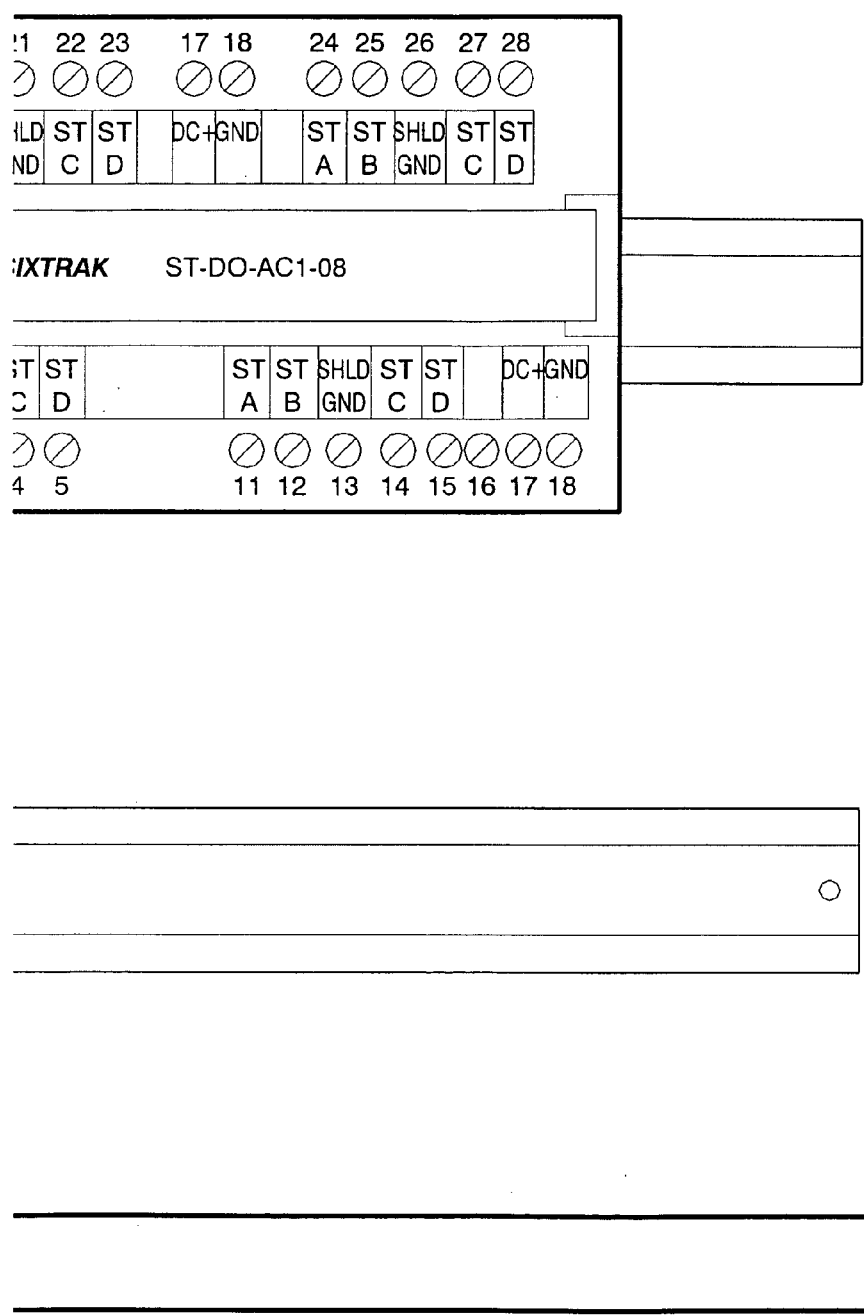
Figures 1, 5A:
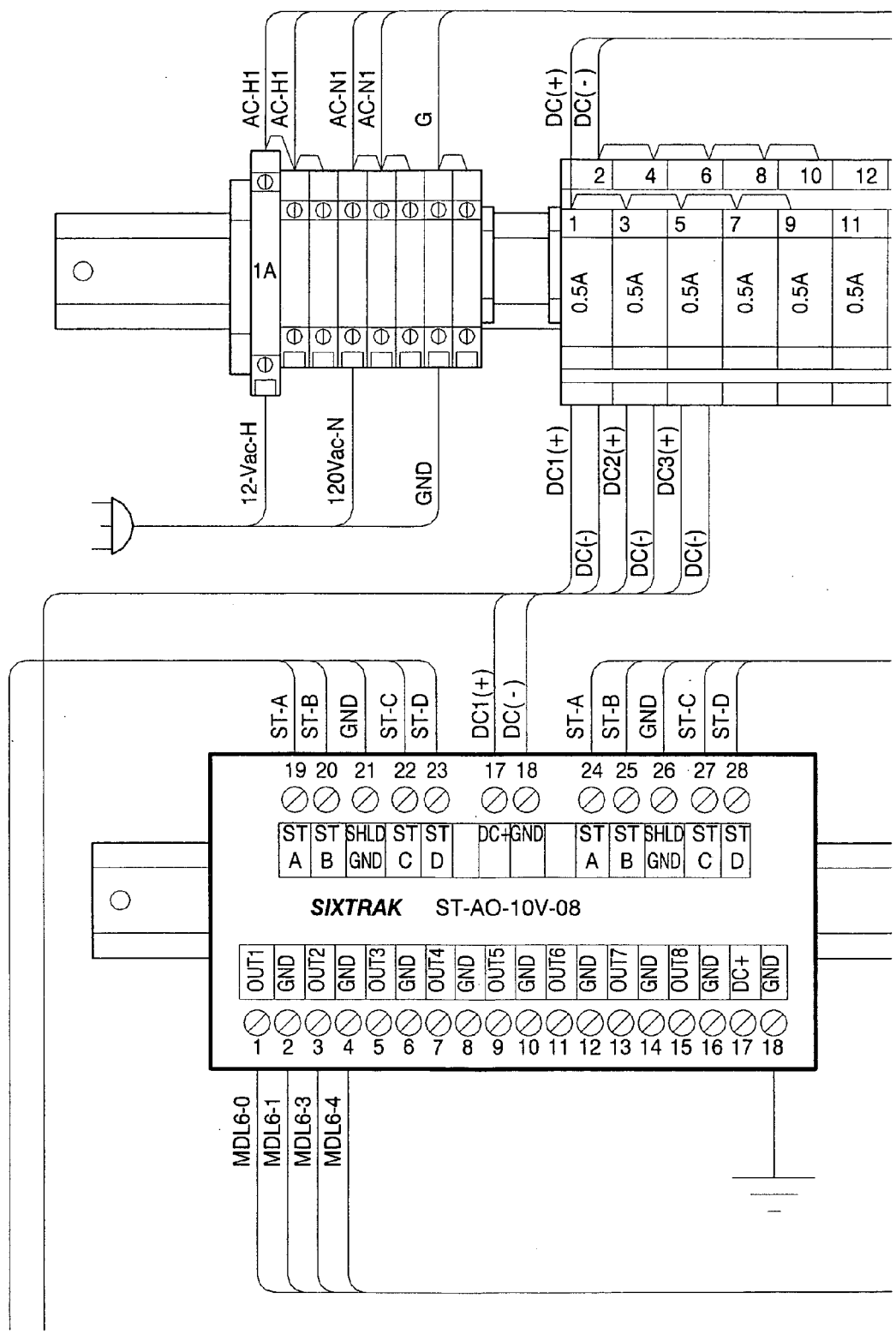
Figures 2, 5A:
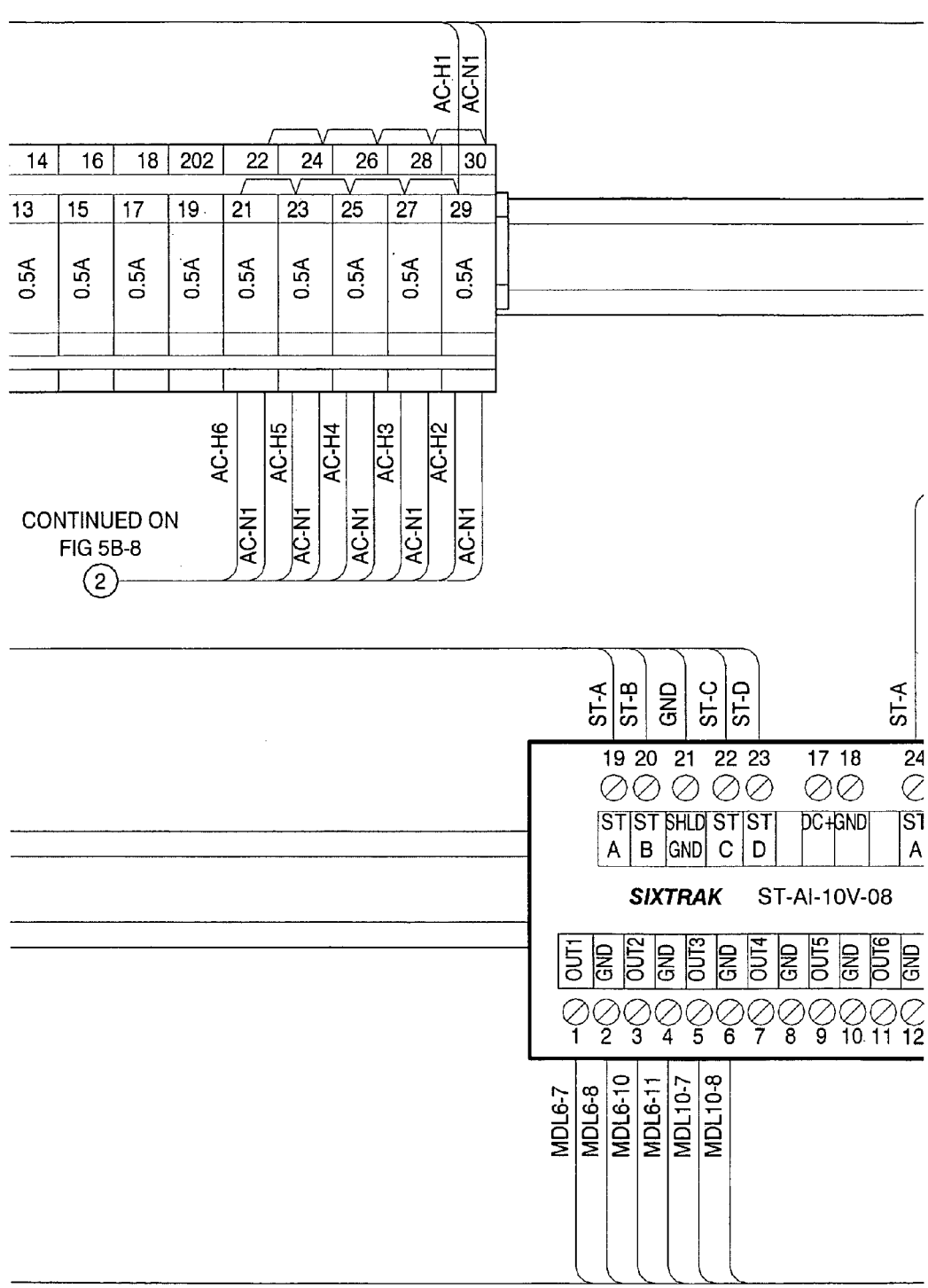
Figure 5A:
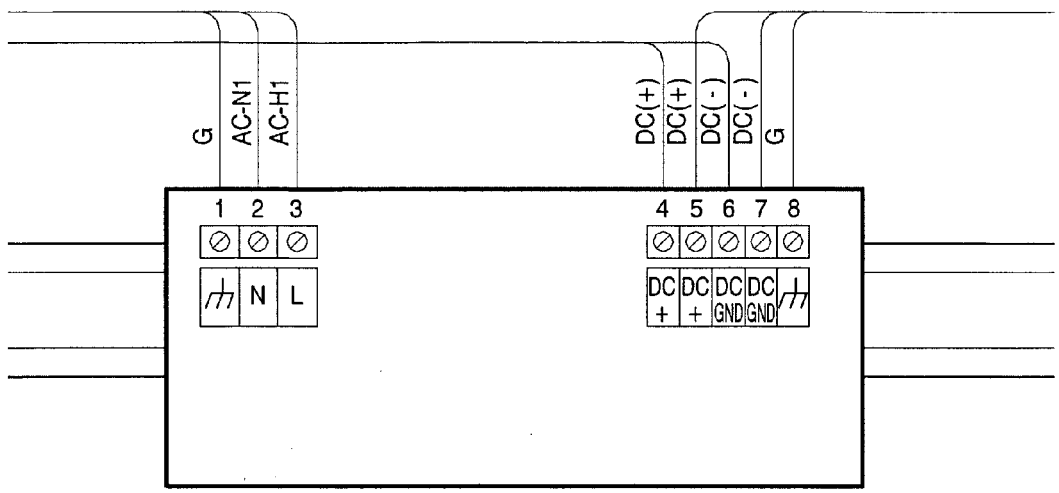
FIG. 5B is a wiring diagram illustrating a preferred method of interconnection for the components of the simulator of FIG. 4B.
Figure 3:
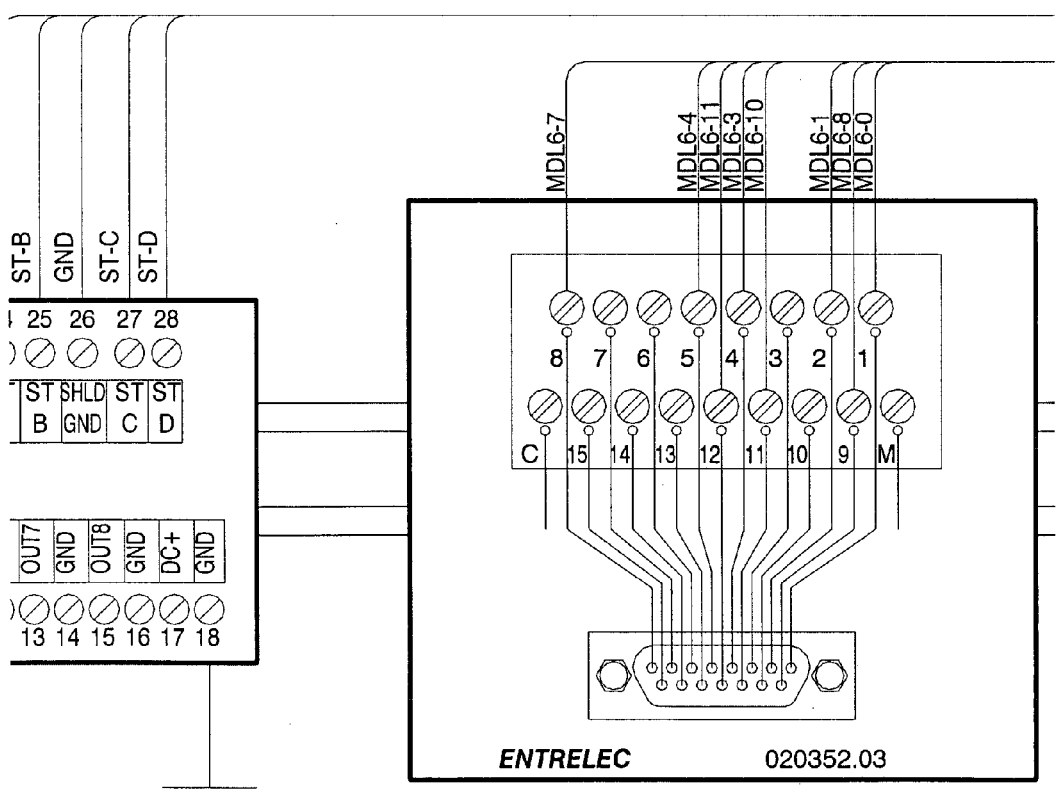
Figure 5A:
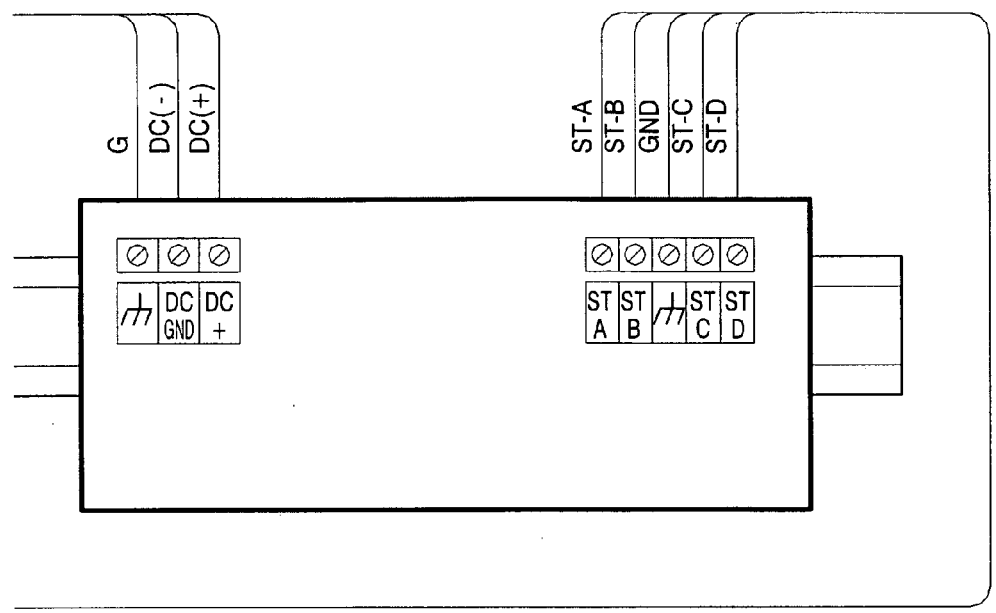
Figure 4:
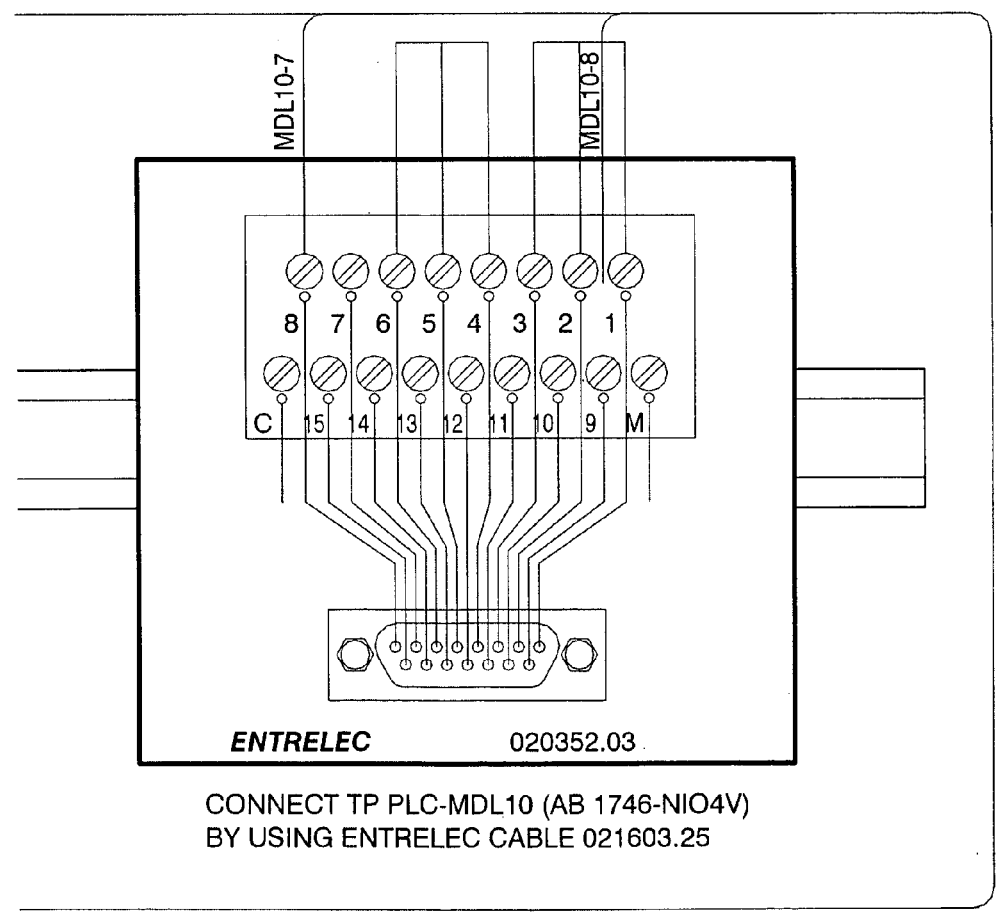
Figures 5, 5A, 6:
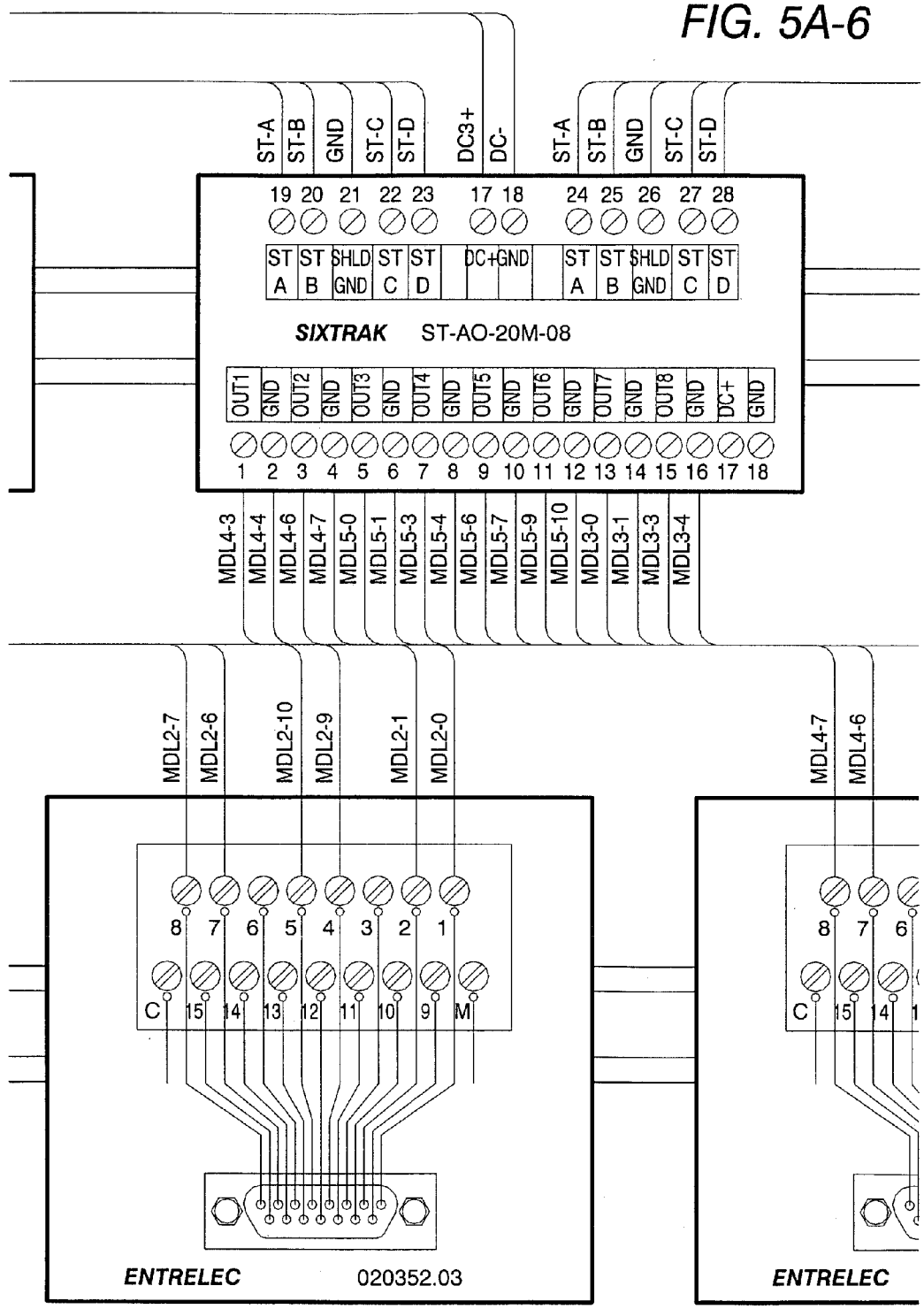
Figures 5, 5A, 6, 7:
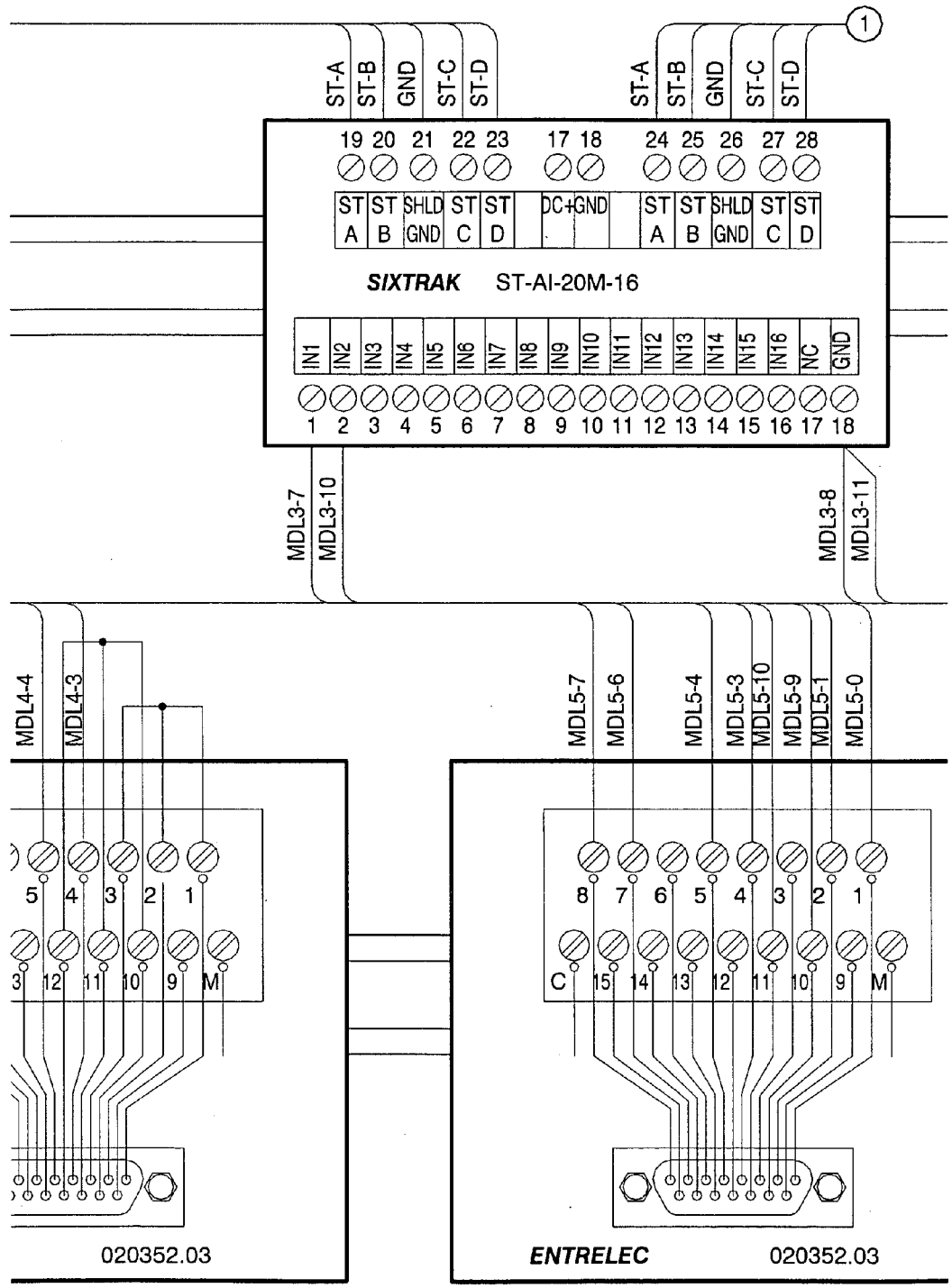
Figures 5, 5A, 6, 7, 8:
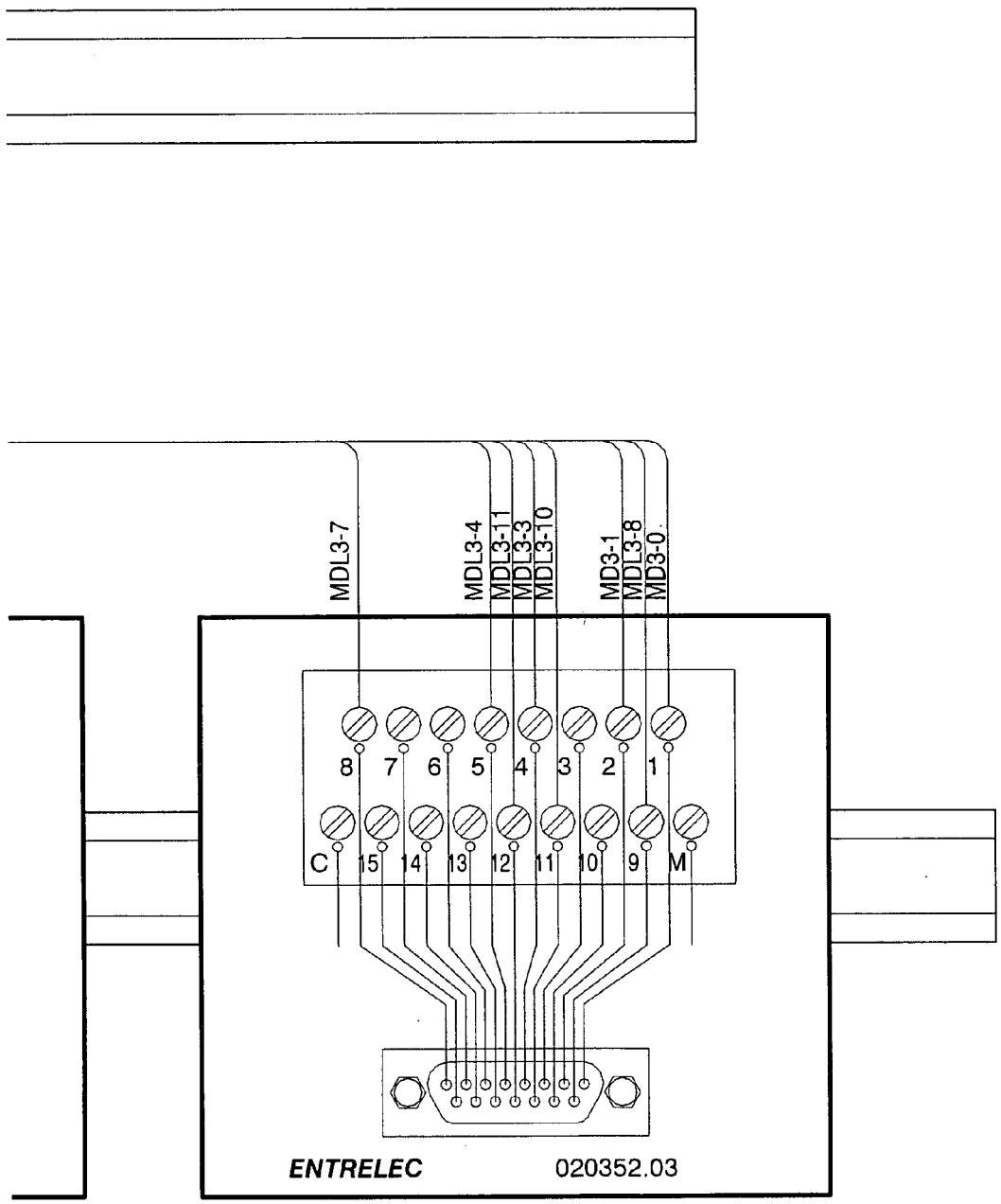
Figures 1, 5B:
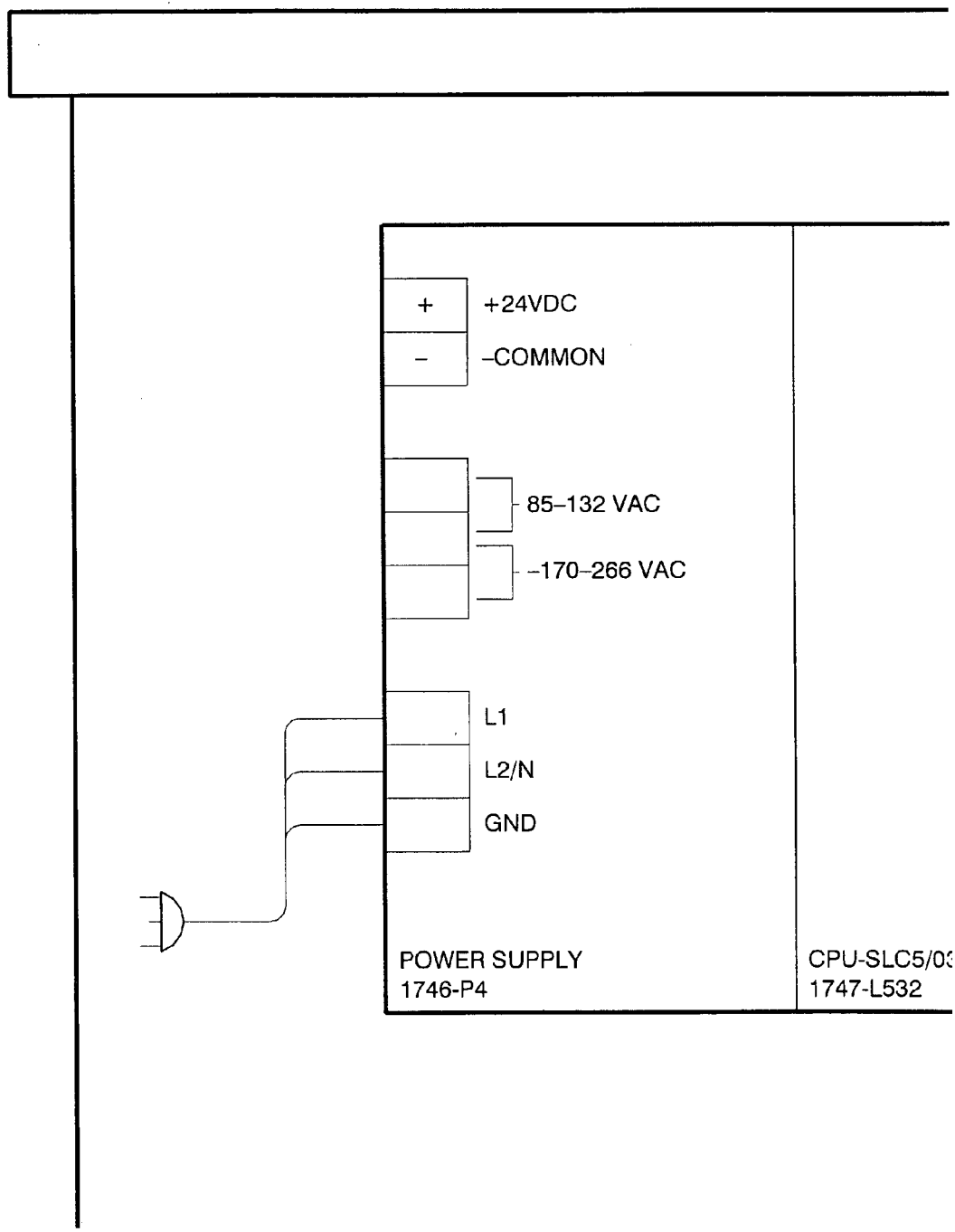
Figures 4, 5B:
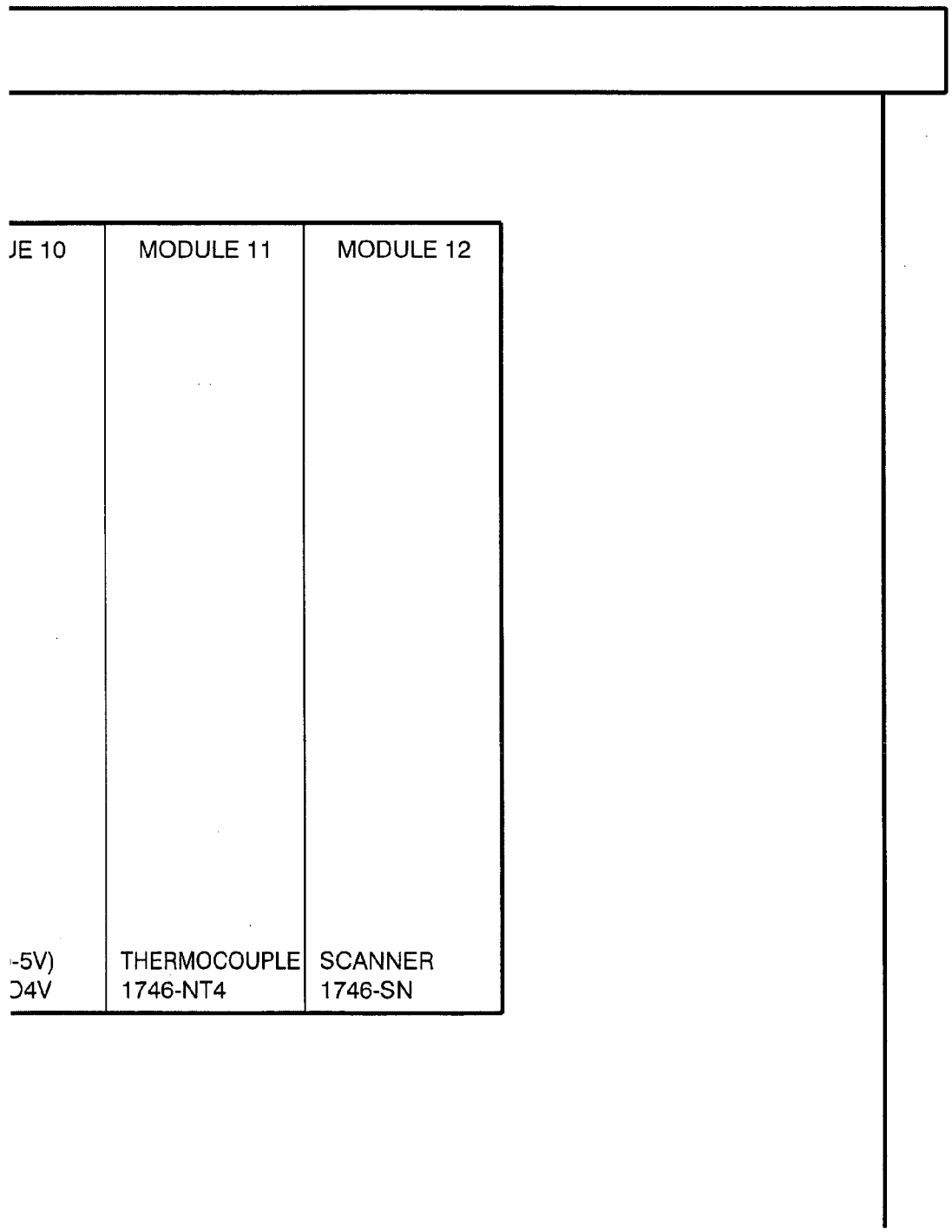
Figures 5, 5B:
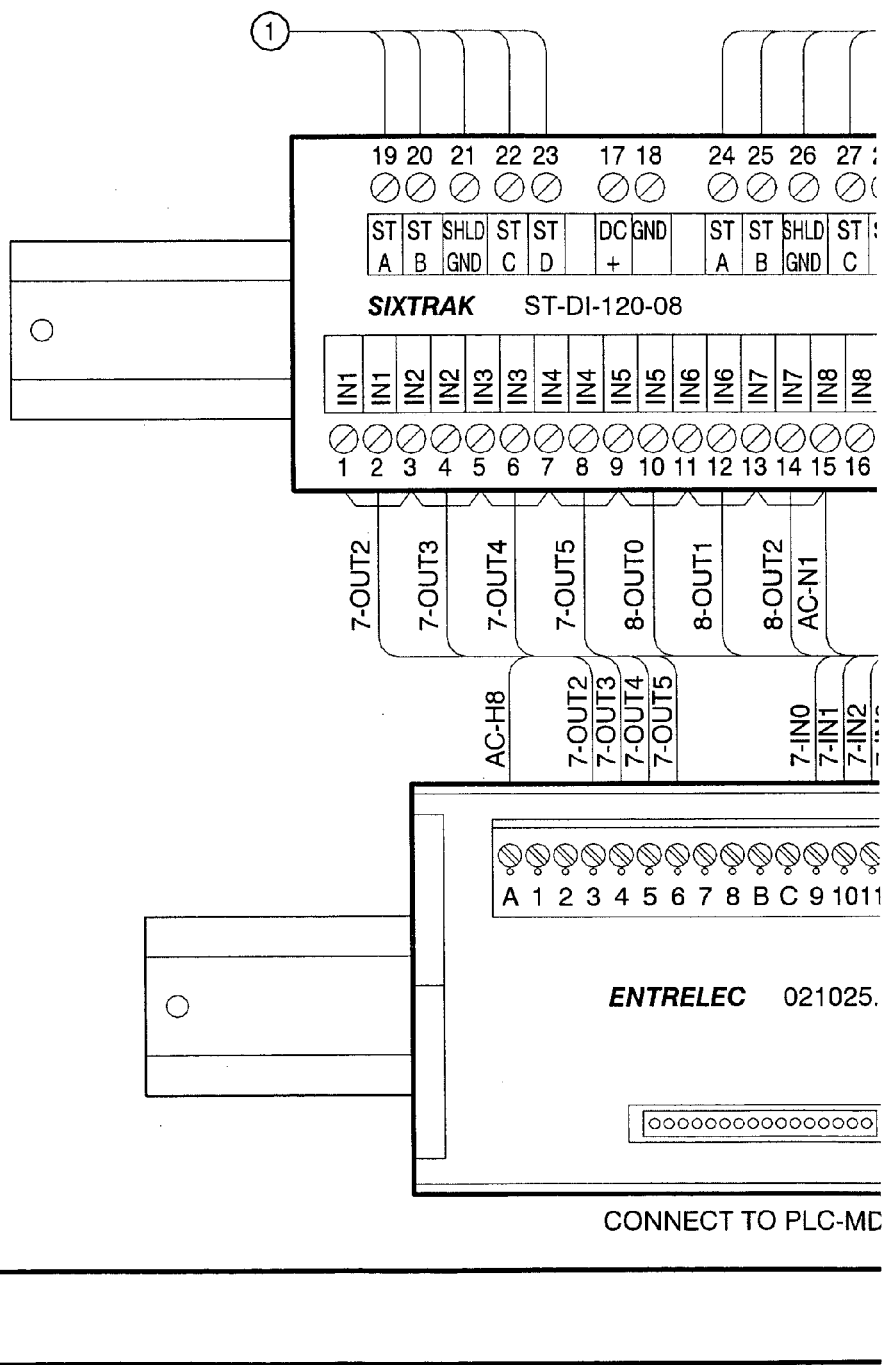
Figures 5, 5B, 6:
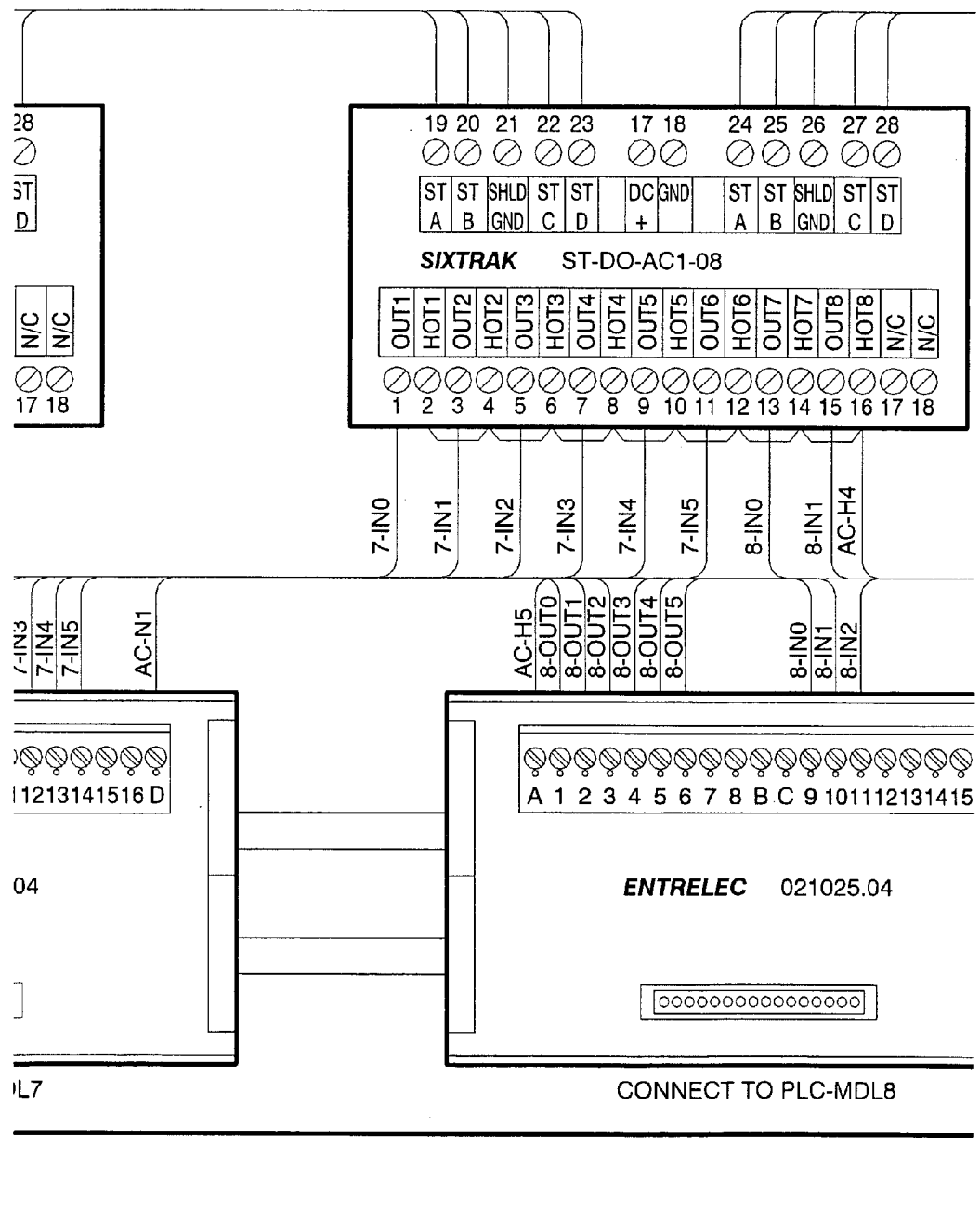
Figures 5, 5B, 6, 7:
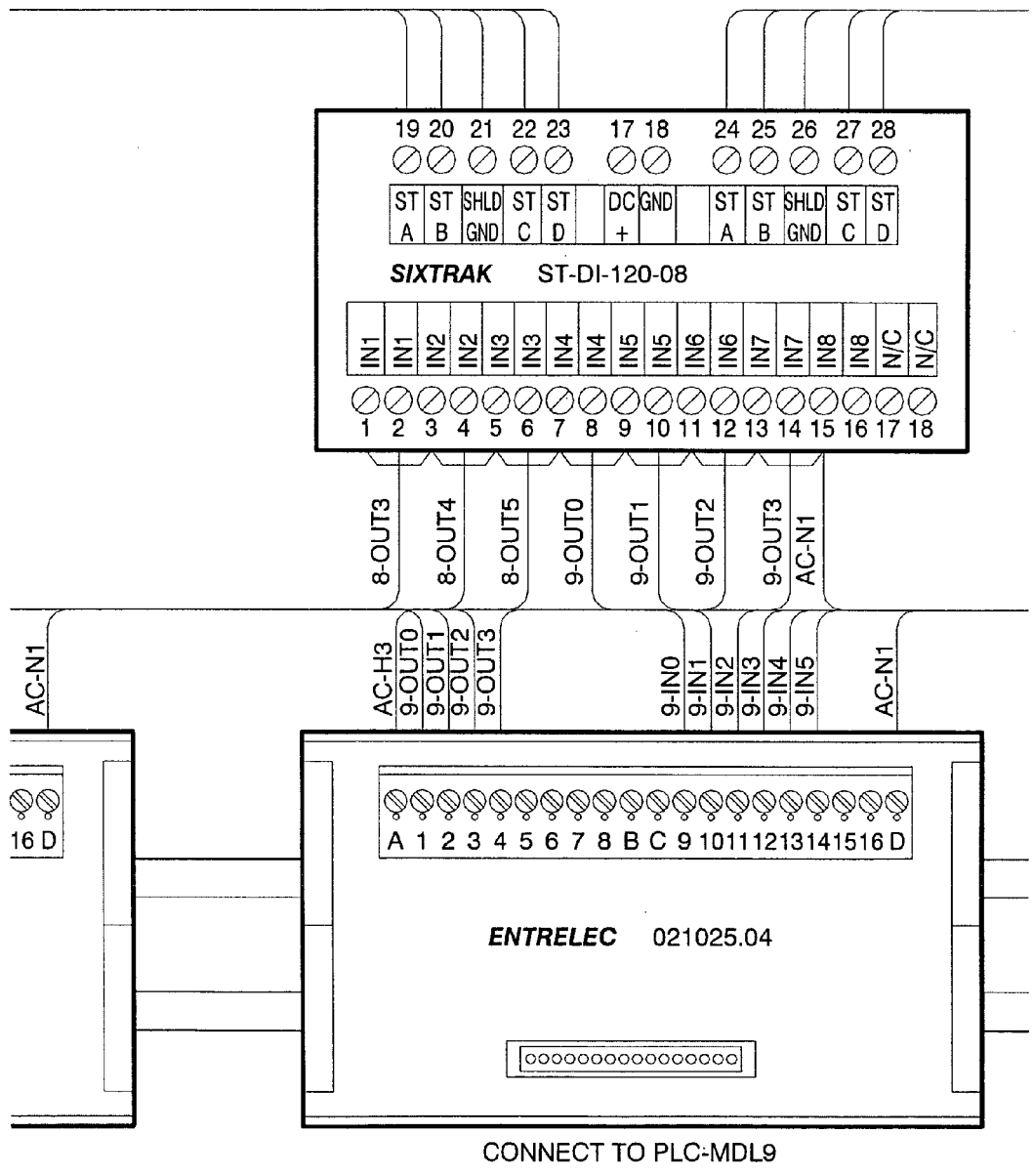
Figures 5, 5B, 6, 7, 8:
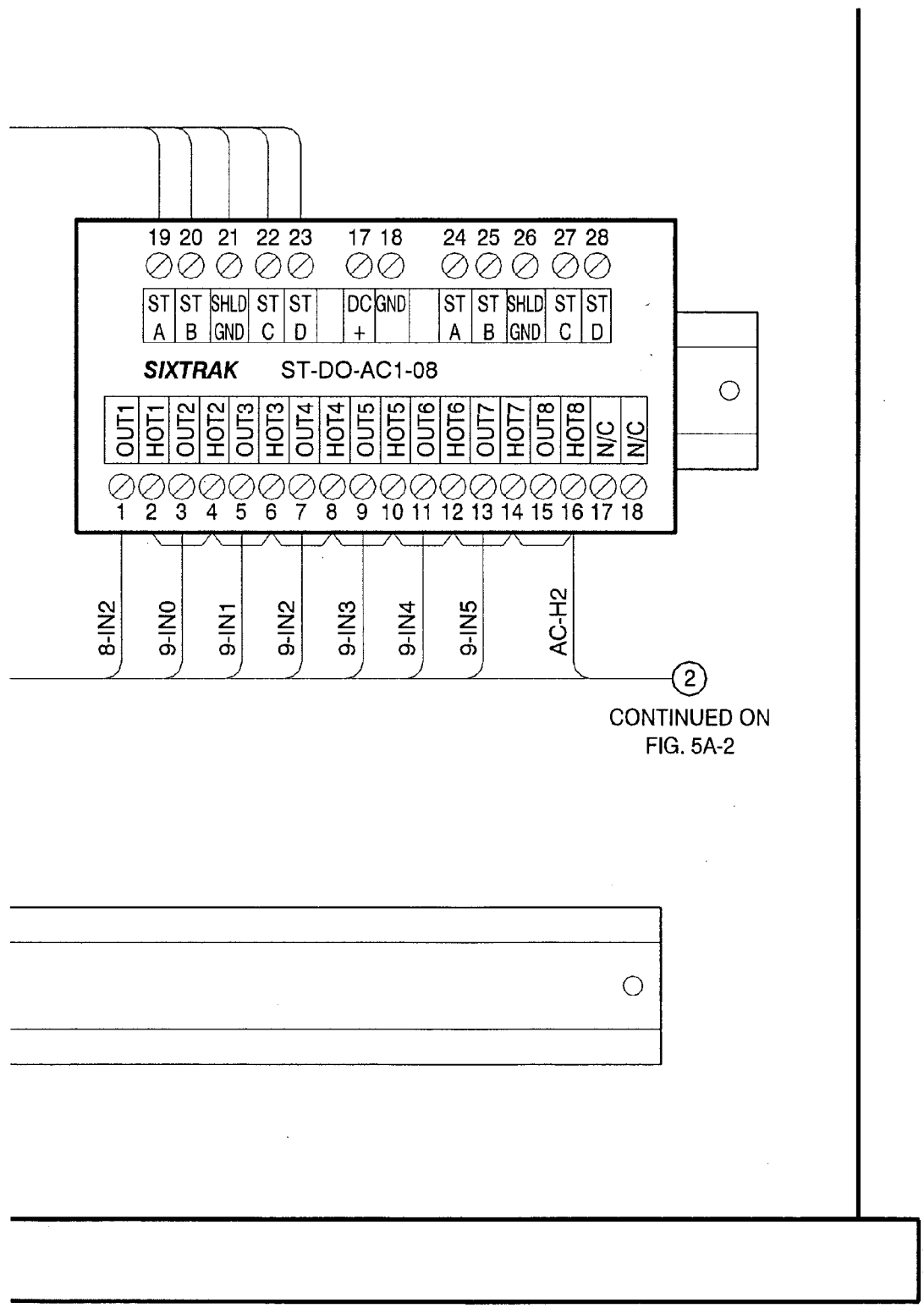
Figures 1, 6:
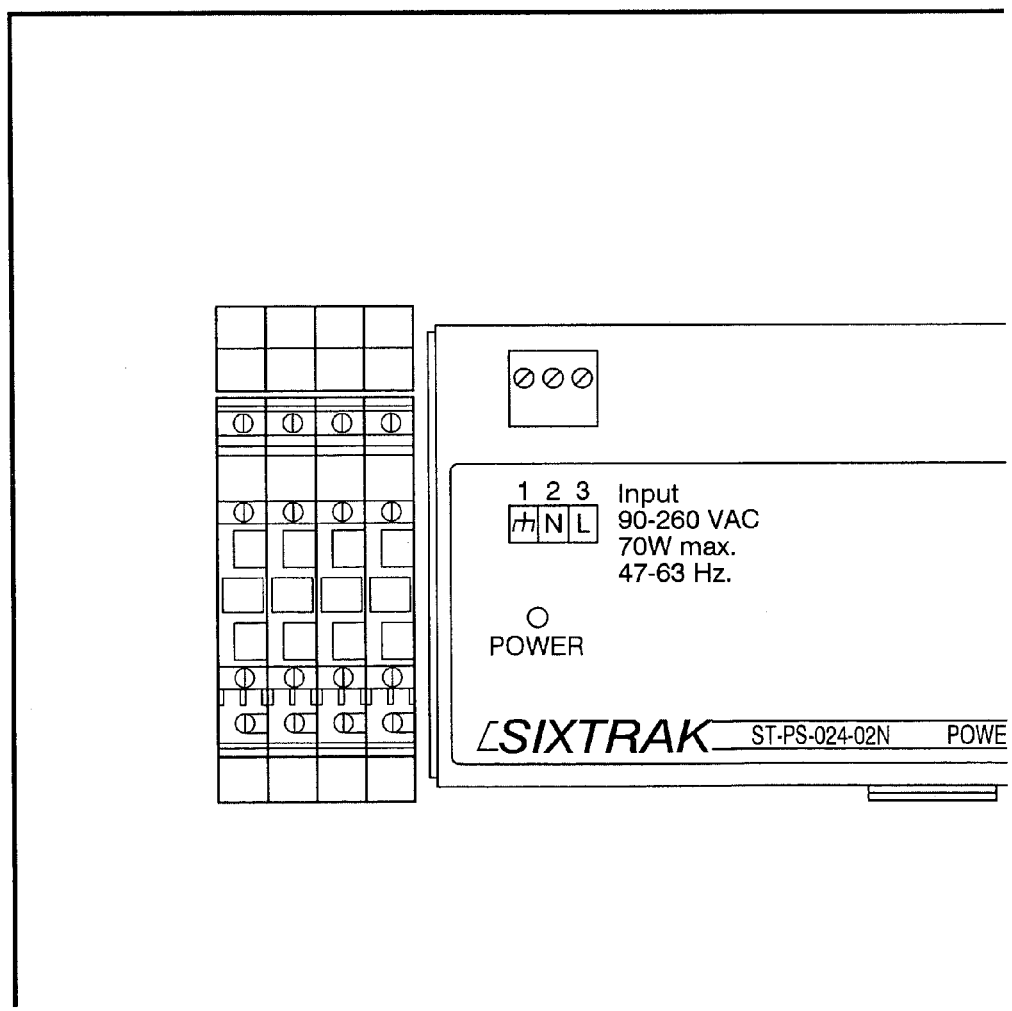
Figures 2, 6:
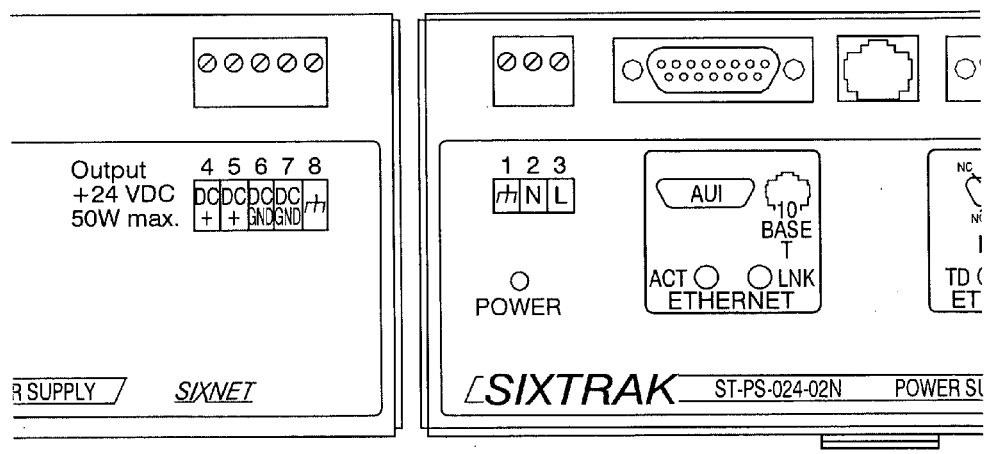
Figures 3, 6:
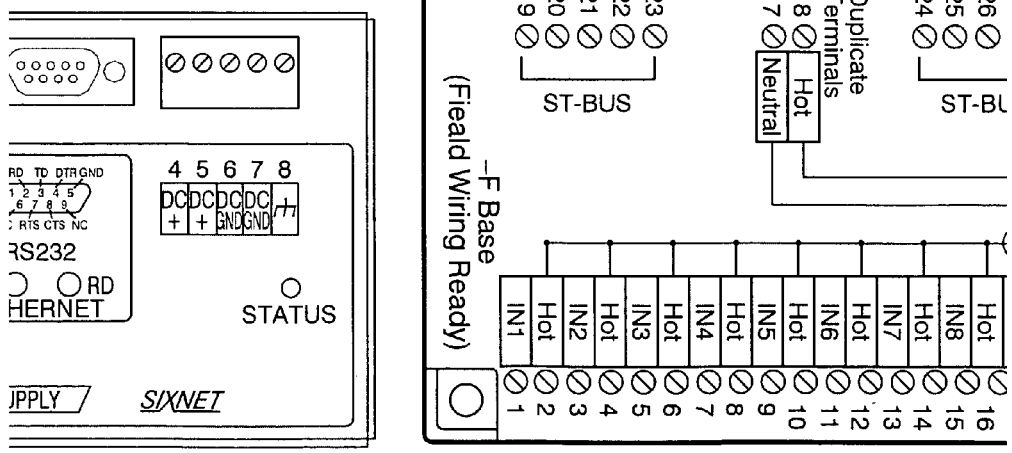
Figures 4, 6:
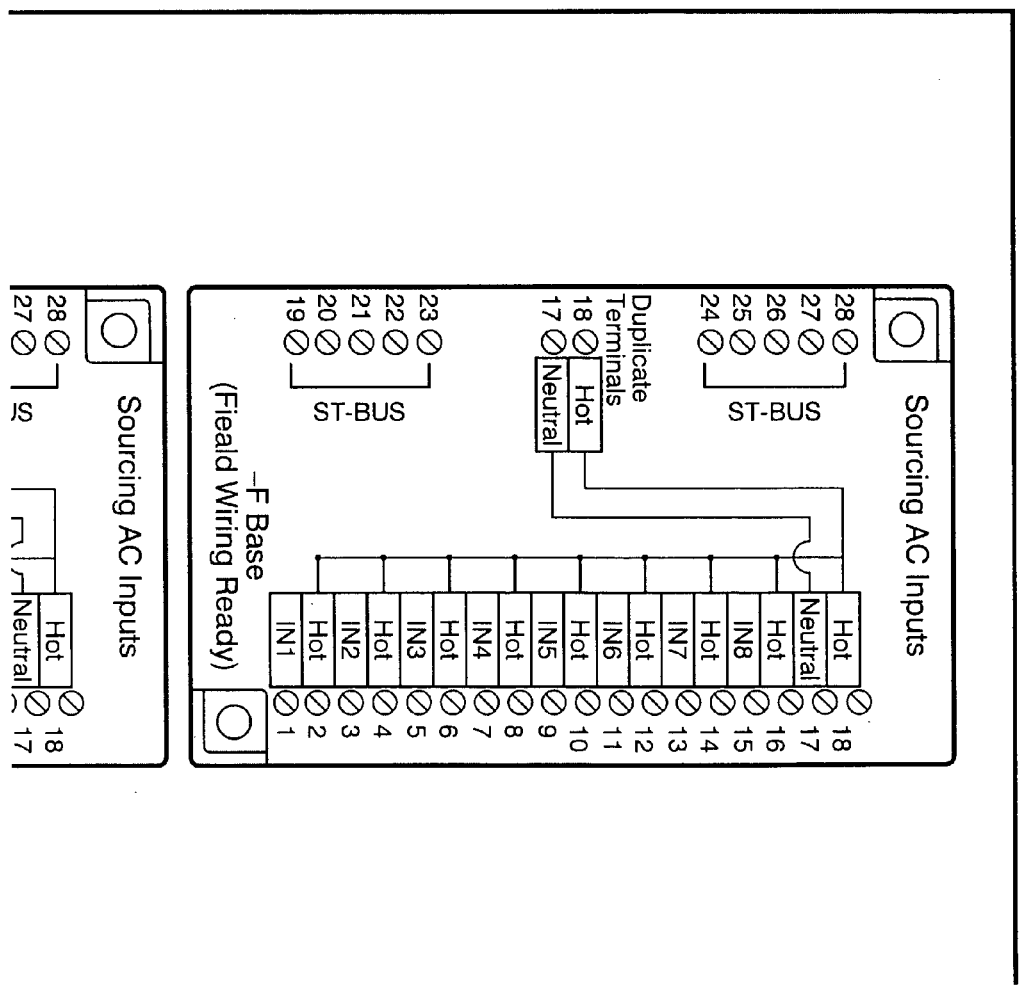
Figures 5, 6:
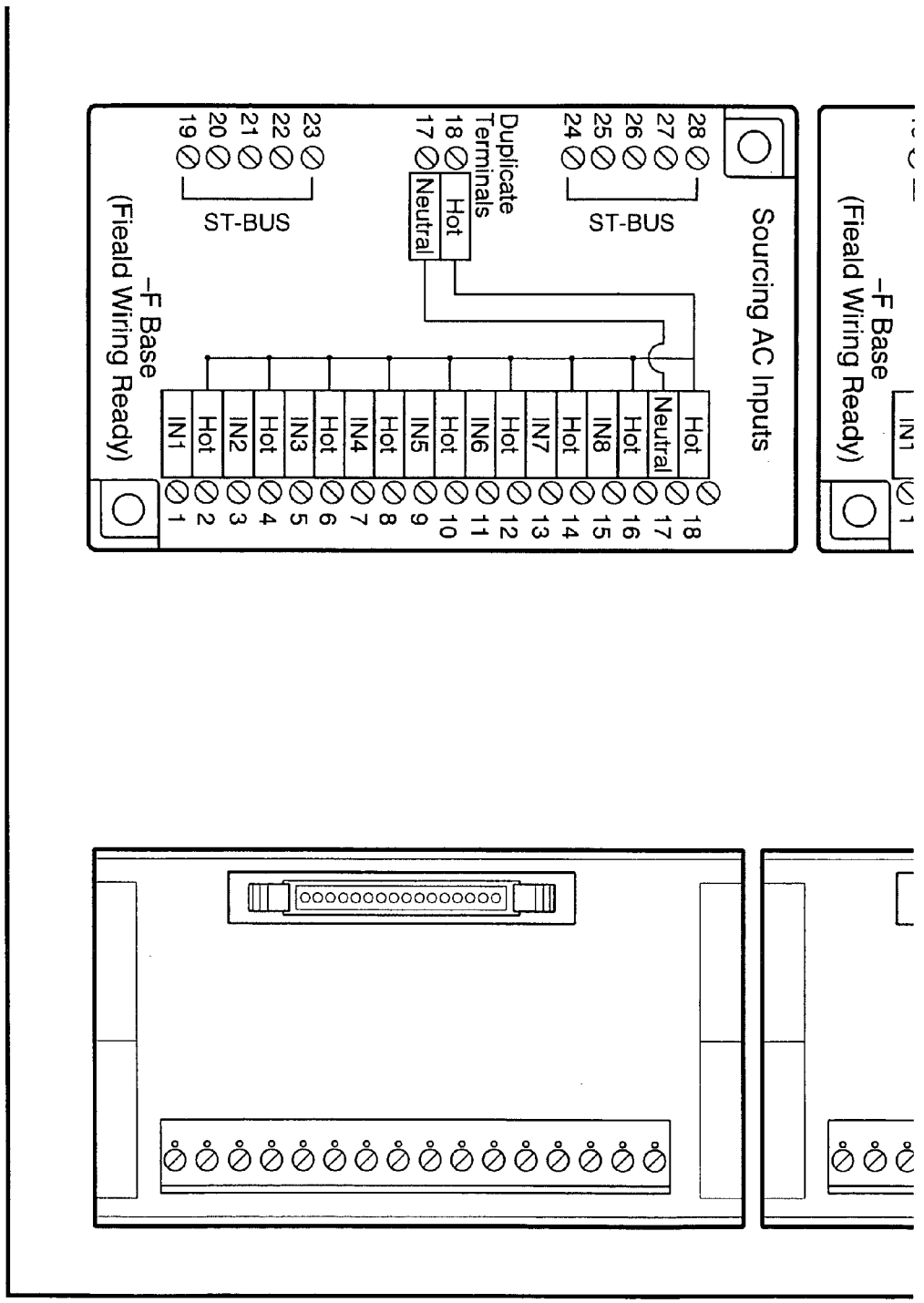
Figure 6:
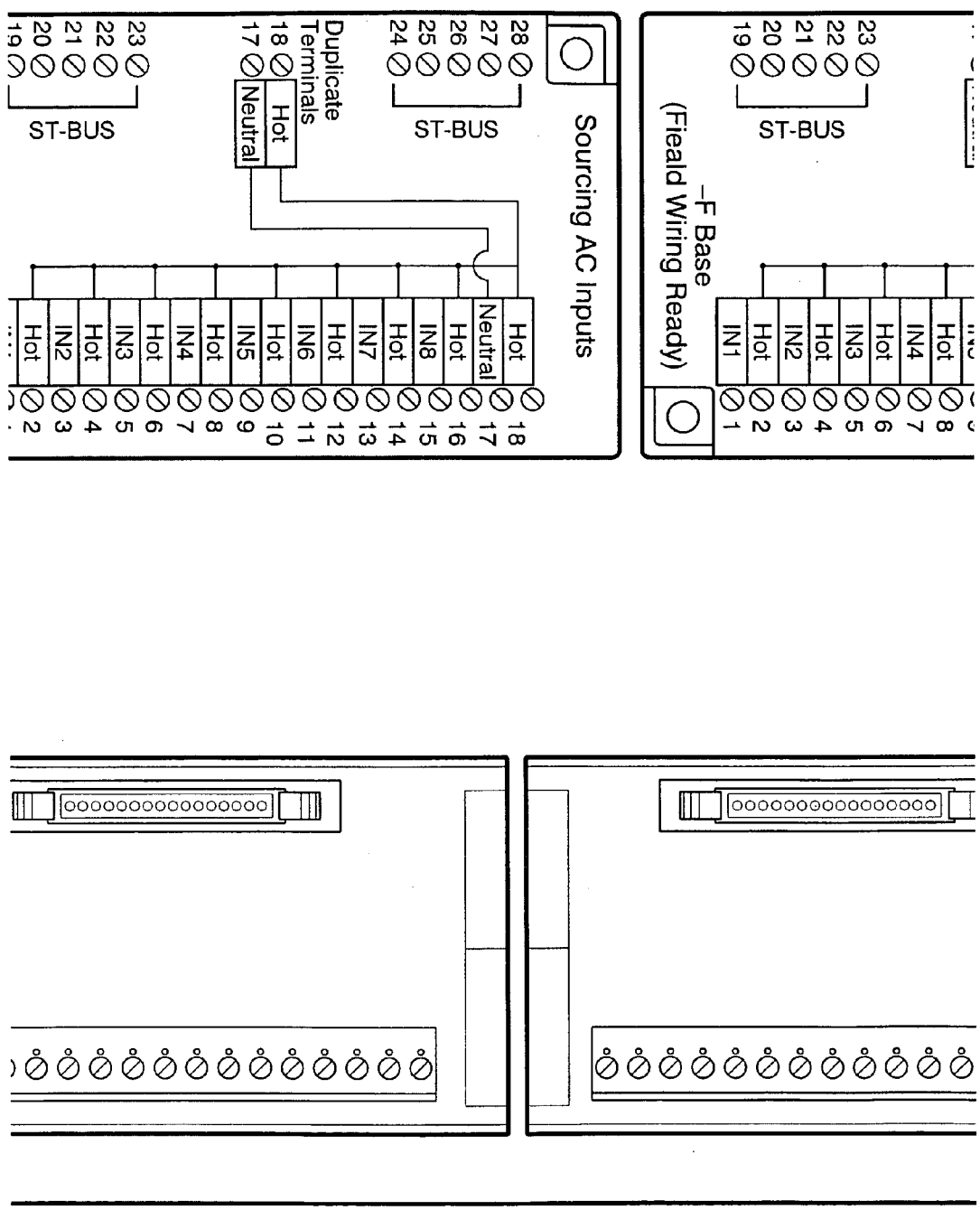
Figures 6, 7:
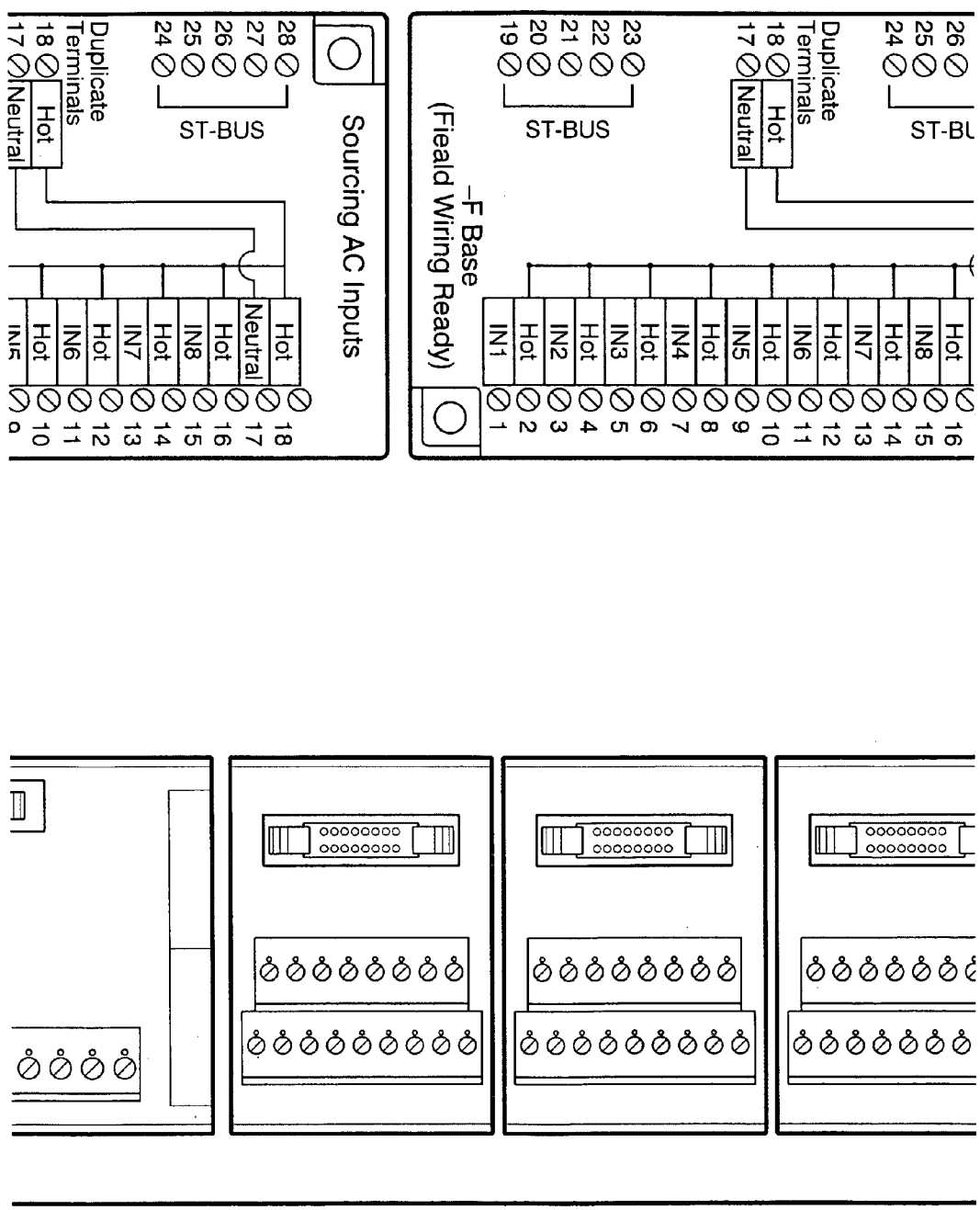
Figures 6, 7, 8:
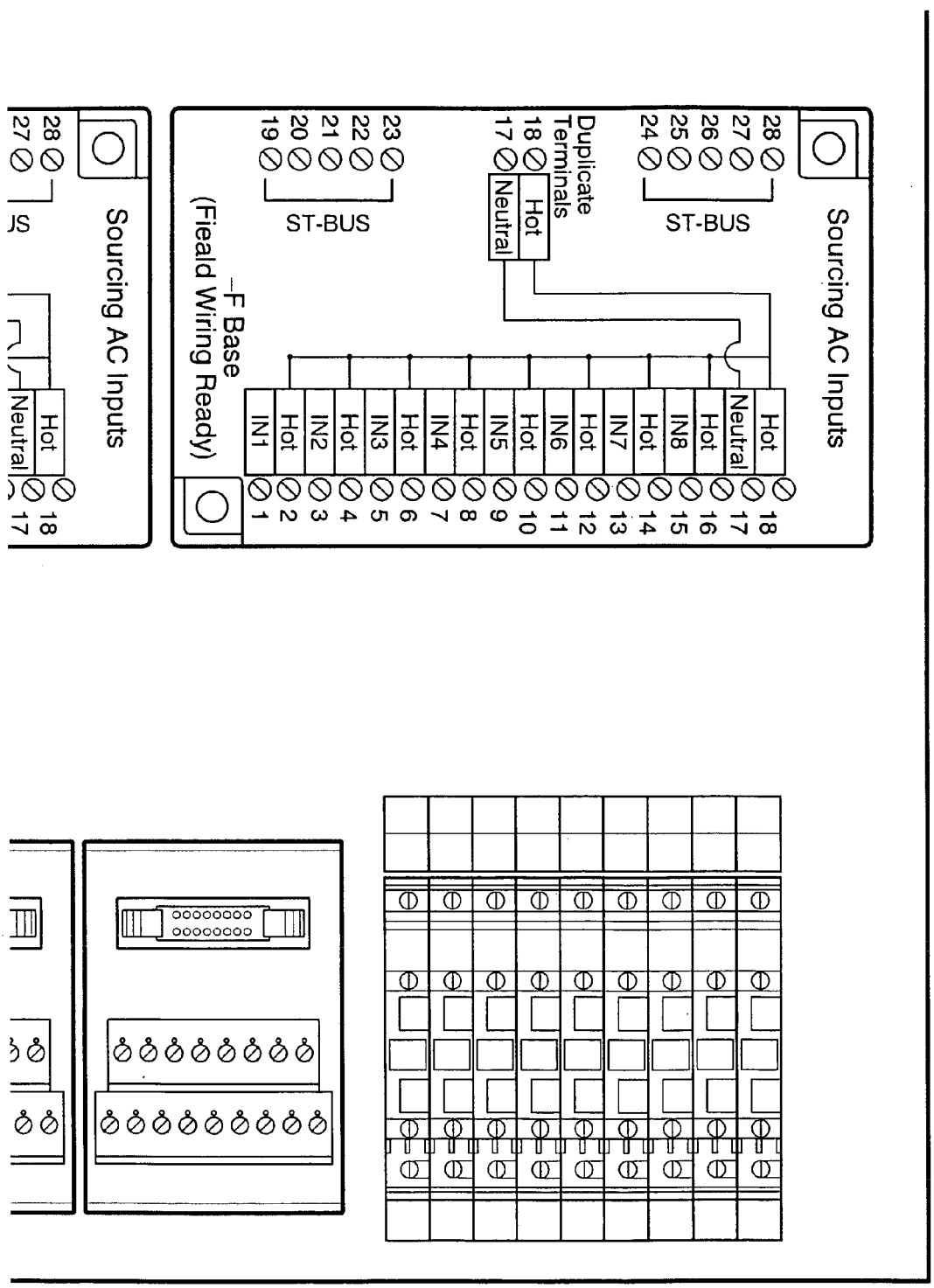
Figure 7:
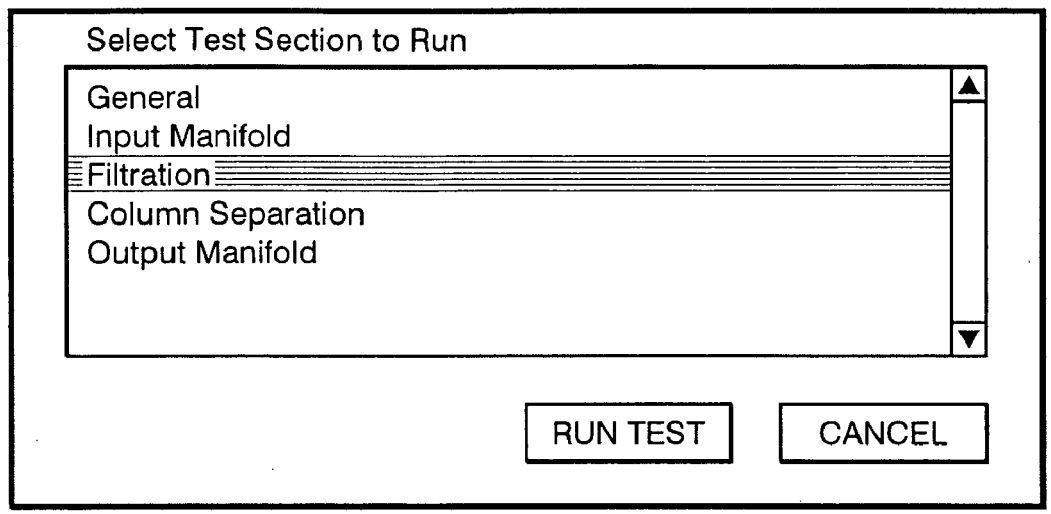
Figure 8:
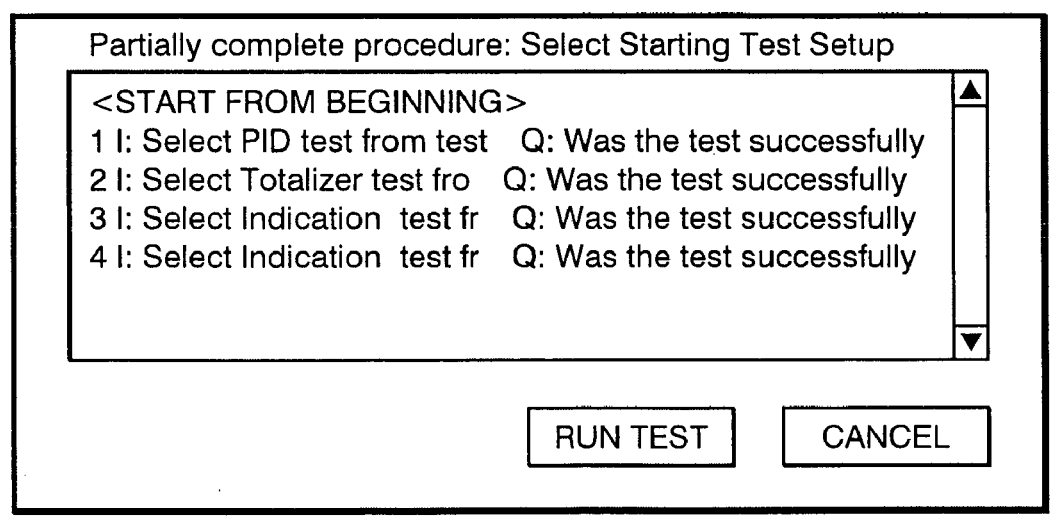

I/O simulator modules 120 may comprise PLCs or smart I/O systems. The SIMCart 10 of FIG. 1 utilizes several Sixnet I/O related products including ST-DI-024-16H, ST-PS-024-02N, ST-DO-DC2-16H, ST-AI-20M-16H, ST-AO-20M-08F, ST-DI-120-08U, ST-DO-AC1-08U, and ST-GT-ETH-24P. Details of the preferred Sixnet products are attached to the provisional application as part of its disclosure, said provisional application having previoiusly been incorporated by reference herein. FIGS. 4A and 4B provide a diagram of a preferred layout of components in SIMCart 10, and FIGS. 5A and 5B provide corresponding wiring diagrams showing a preferred method for interconnecting the components of SIMCart 10.

An alternative embodiment utilizes a smaller number of components so that a SIMCart type simulator can be fit within a carrying case. FIG. 6 provides a diagram of a preferred layout of components in such an embodiment.

HMI/configurator 130 of SIMCart 10 is contemplated as being a general purpose computer such as a laptop PC ("PC"). Portability is particularly desirable as it facilitates the transportation of HMI 130 into the field to support on-site testing of an installed target CS 20. HMI 130 is contemplated as incorporating software which allows testing of alarm responses (including deadbands), loops, and logic, and reporting of HMI readouts, trend graphs, alarms, reports, system requirements, etc. Test results are stored in the form of textual date and time stamped data, graphs, and tester responses to prompted questions.

In a preferred embodiment, HMI 130 includes a multi-tasking operating system, preferably Windows NT™, which is capable of supporting a graphical user interface ("GUT") and a relational database system (preferably Microsoft Access™), as well as software for controlling I/O simulator modules 120, and testing target CS 20. HMI 130 is also preferred to include an Ethernet network interface card for connection to communication channel 160 which is preferred to be an TCP/IP based Ethernet network. It is also preferred that HMI 130 of SIMCart 10 be detachable from the rest of SIMCart 10 to allow it to be used independently as an onsite verification tool.

HMI/configurator 130 provides for downloading test relational databases, initiating tests and capturing tester responses and comments, and generating reports. The test databases include test cases, expected results for test comparison and exception generation. An overall test planner database organizes the sequence of test events. Being as the test databases are derived from the requirements database, the system owner is assured of lock-step configuration control and traceable requirements testing.

It is preferred that configurator 130 utilize a relational database coupled to a GUI to allow entry of and storage of test requirements at a high level, and to provide tools for deriving lower level sets of test instructions from such high level requirements in a manner which maintains a correlation between lower level test sets and higher level requirements. By maintaining such a correlation, changes to high level requirements can be quickly, and sometimes automatically, incorporated into the lower level test sets. Such lower level test sets will be used to drive and control both automatic and interactive testing of target CS 20. By maintaining a correlation between high level and low level requirements, reports showing the test steps used to verify satisfaction of the high level requirements through performance of the low level test sets can be generated.

Figure 9:
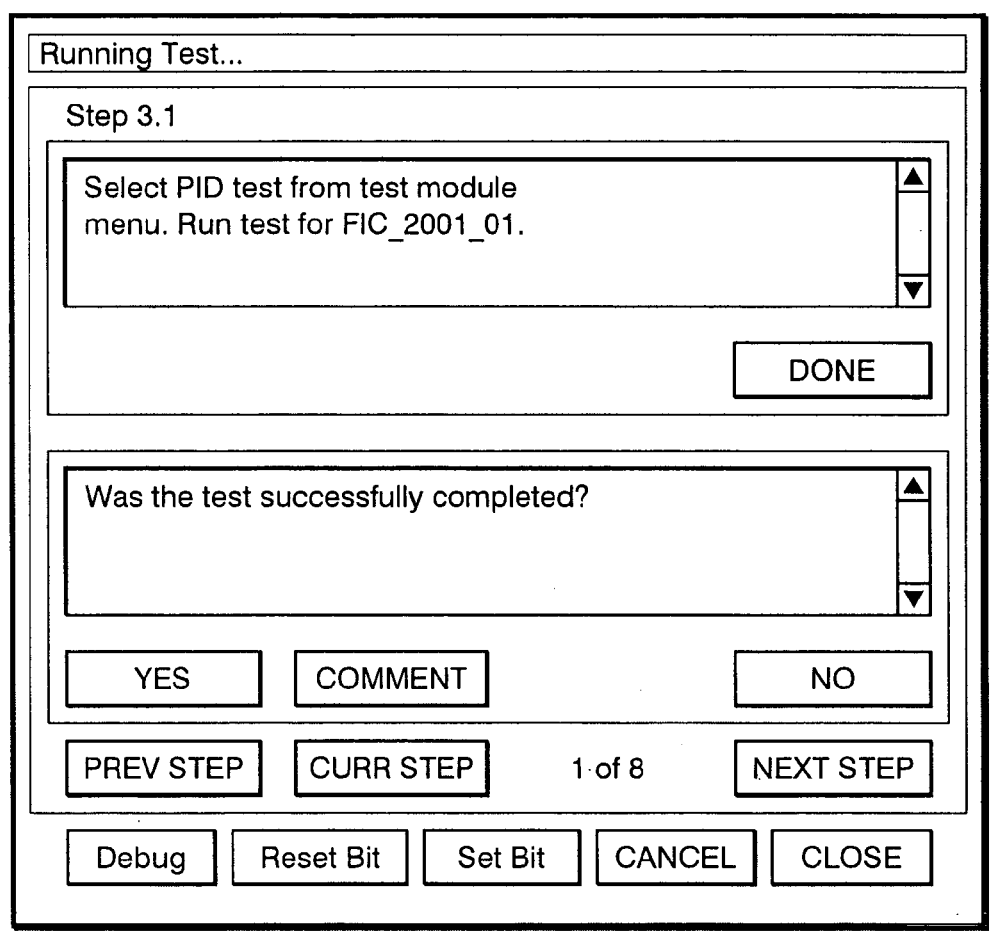
FIG. 9 is a screen capture of a simulator HMI screen wherein an operator is being prompted to perform a first test.
Figure 10:
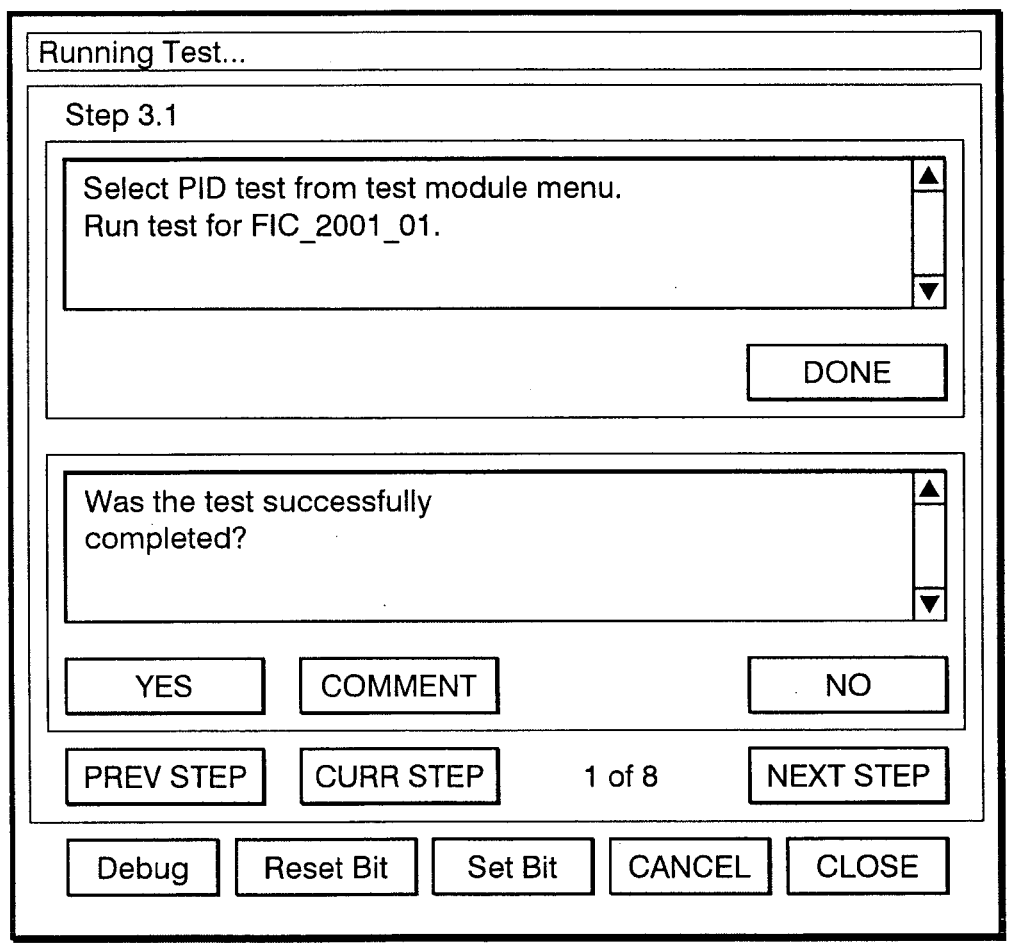
FIG. 10 is a screen capture of a simulator HMI screen wherein the operator is being prompted to enter the results of the test of FIG. 9.
Figure 11:
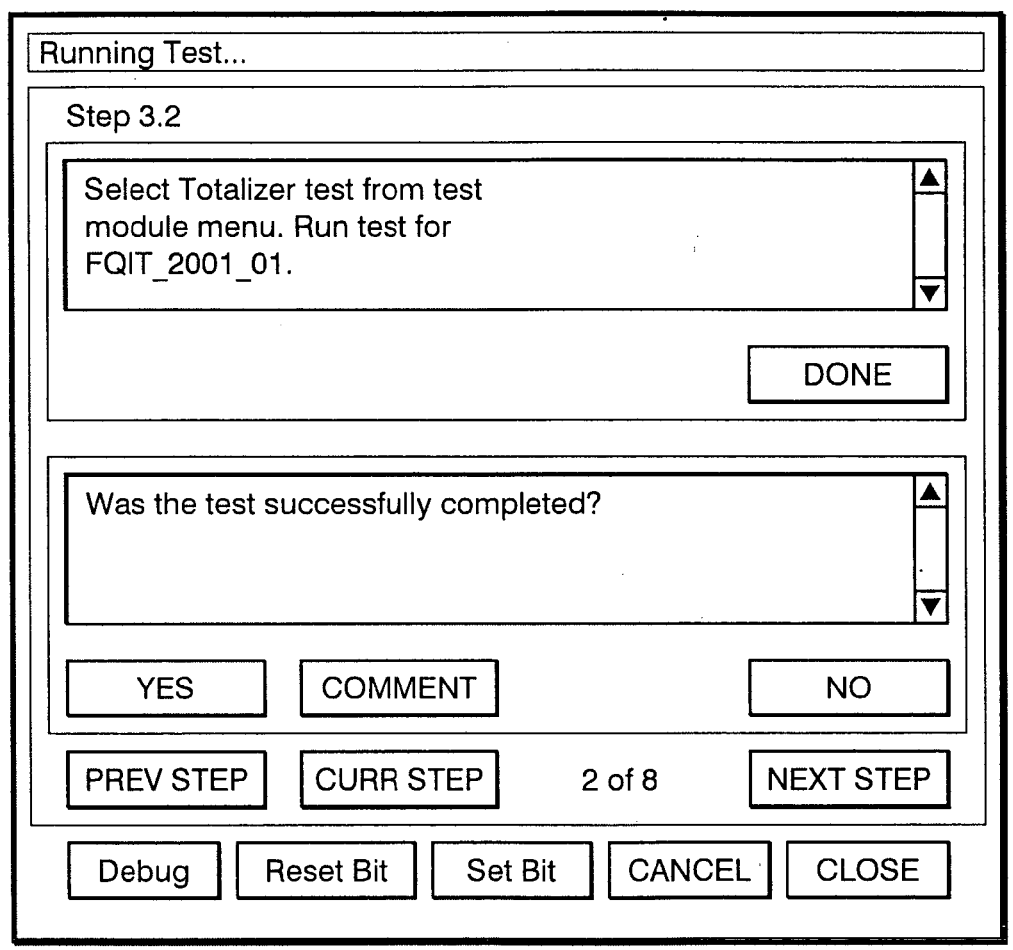
FIG. 11 is a screen capture of a simulator HMI screen wherein an operator is being prompted to perform a second test.

It is contemplated that the relational database used by configurator 130 to maintain test requirements and instructions should provide for the specification of: (1) initial values, an operational range, a deadband, and a physical range for each I/O component to be tested to allow the testing of alarms when values are within and outside of such ranges; (2) standardized questions for prompting the operator to perform various functions or to provide responses; (3) sets of instuctions and questions for interactive testing (or possibly automatic testing) of the HMI portion of target CS 20; (4) parameters for PID loop testing; (5) parameters for indicator testing; (6) general target system requirements, as well as supporting any other tables required for proper functioning of SIMCart 10. FIG. 7 provides a screen capture image of a simulator HMI screen wherein an operator is being prompted to select a test section to run. FIG. 8 provides a screen capture image of a simulator HMI screen wherein an operator is being prompted whether to run a particular test or an entire test procedure. FIG. 9 provides a screen capture of a simulator HMI screen wherein an operator is being prompted to perform a test. FIG. 10 provides a screen capture of a simulator HMI screen wherein an operator is being prompted to enter the result of the test of FIG. 9. FIG. 11 provides a screen capture of a simulator HMI screen wherein an operator is being prompted to perform another test.

Hardcopy device 140 is preferred to be a printer suitable for connection to HMI 130, and for printing hardcopy of tests, test results, and audit information as well as other reports discussed herein.

Wiring harnesses 150 may take on almost any form so long as they properly transmit I/O signals between SIMCart 10 and target CS 20. However, it is preferred that wiring harnesses 150 be chosen to facilitate the coupling of target CS 20 to SIMCart 10 and the simulation of the field wiring to which target CS 20 will be coupled in its operational environment. It is contemplated that several different harnesses may be included with the SIMCart 10 with each harness being designed to facilitate the coupling of SIMCart 10 to a particular type of target CS 20. The inclusion of such pre-configured harnesses is contemplated as facilitating the use of SIMCart 10 to test a variety of standard control systems such as Allen-Bradley PLC-5 controllers or Siemens S7 controllers.

Communication channel 160 is preferred to be a TCP/IP based Ethernet network and is preferred to be shared between SIMCart 10 and target CS 20 to allow flexible interaction between HMI 130, I/O simulator modules 120, HMI 230, PLC 270, and I/O interface 220. However, it is contemplated that other communication methods such as RS-232 interfaces, token ring networks, FDDI networks, proprietary control busses, etc. may also be used to provide a communication channel between one or more components of SIMCart 10 and target CS 20.

As previously discussed, the HMI/configurator portion 130 of SIMCart 10 is useful both in the operation of SIMCart 10, but also as a detachable validation and/or training tool. It is contemplated that HMI/configurator 130 comprise the software and one or more databases necessary to allow it to perform its training and/or validation functions. Such functions might include, among others, the ability to control access by requiring an operator to log in, the ability to simulate a particular function and to test the capability of the target CS to respond to a sensor's entire range of input, the ability to prompt the operator to perform operations using the target CS HMI, and automatically performing tests against target CS when such tests do no require manual operations by an operator.

Thus, a particular configurator embodiment is likely to have the ability to store and run multiple tests wherein each test comprises one or more steps. In running a particular test or sequence of test steps, the configurator will prompt the operator to perform a function on the target CS whenever manual intervention by the operator is required, but will automatically (i.e. without operator action) run through any tests steps which do not require such manual intervention. Thus, to test a pump, the configurator may prompt an operator to turn on the pump, then, after the operator has indicated to the configurator that he has turned on the pump, the configurator will ask a question to verify proper operation of the pump such as "Did the pump indicator light turn on?" which the operator can either respond to affirmatively or negatively. If negatively, the configurator will prompt the operator to enter a comment as to what response by the target CS was actually seen. During another step, the configurator may generate simulated events to which the target CS has automated responses which can be detected by the configurator and in which case the simulator will simply simulate the events and monitor the target CS's response. As an example, if a power voltage level exceeds a threshold amount the target CS may be required to cut off the source of power. Such a test would be performed by the simulator at the appropriate point in a test sequence by sending an over voltage signal to the target CS and monitoring the response of target CS to see if a power cutoff signal is sent. Test results, whether operator responses or automatically monitored events/values are also stored in one or more databases so that an exceptions report comparing actual target CS responses to expected results can be generated.

It is contemplated that the configurator will comprise a scalable library of test databases and test functions utilizing the test databases to perform the test steps. Utilizing database tables to store tests and test parameters allows a tester to add new tests and/or test scenarios, and also to modify parameters for existing tests. Such scalable libraries and dynamic updates make for a much more robust and flexible system.

Figures 16, 17:
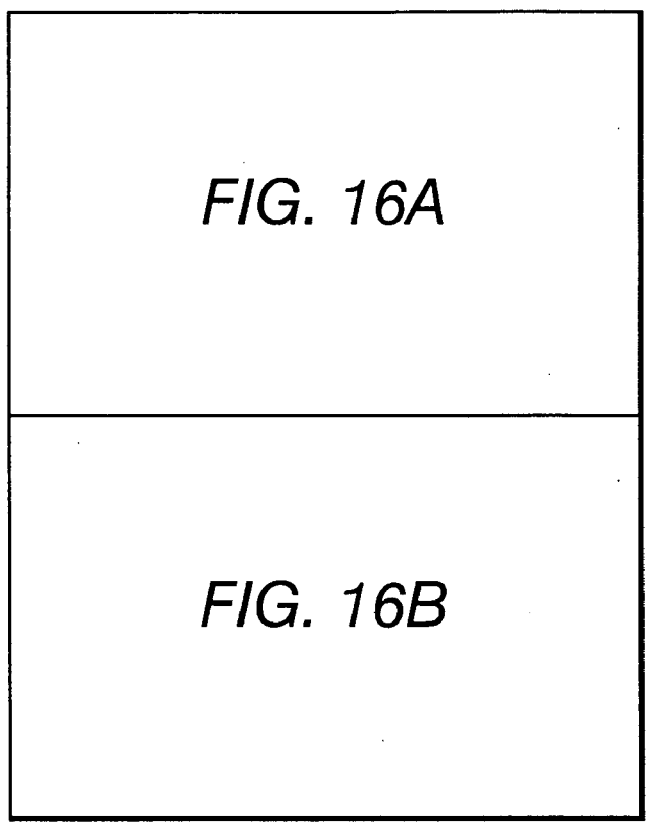
FIG. 16 is a diagram of a simulator HMI database table.
FIG. 17 is a diagram of a simulator HMI database table.
Figure 19:
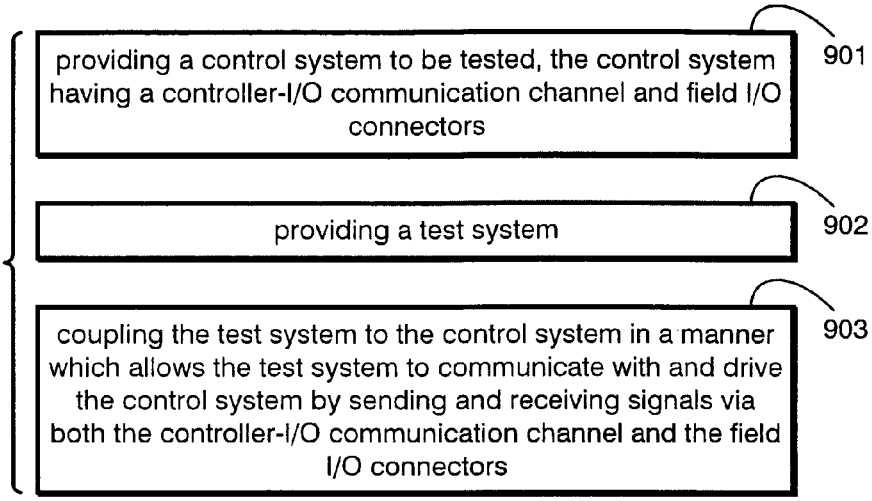
FIG. 19 is a diagram of a first method embodying the invention.
Figure 20:
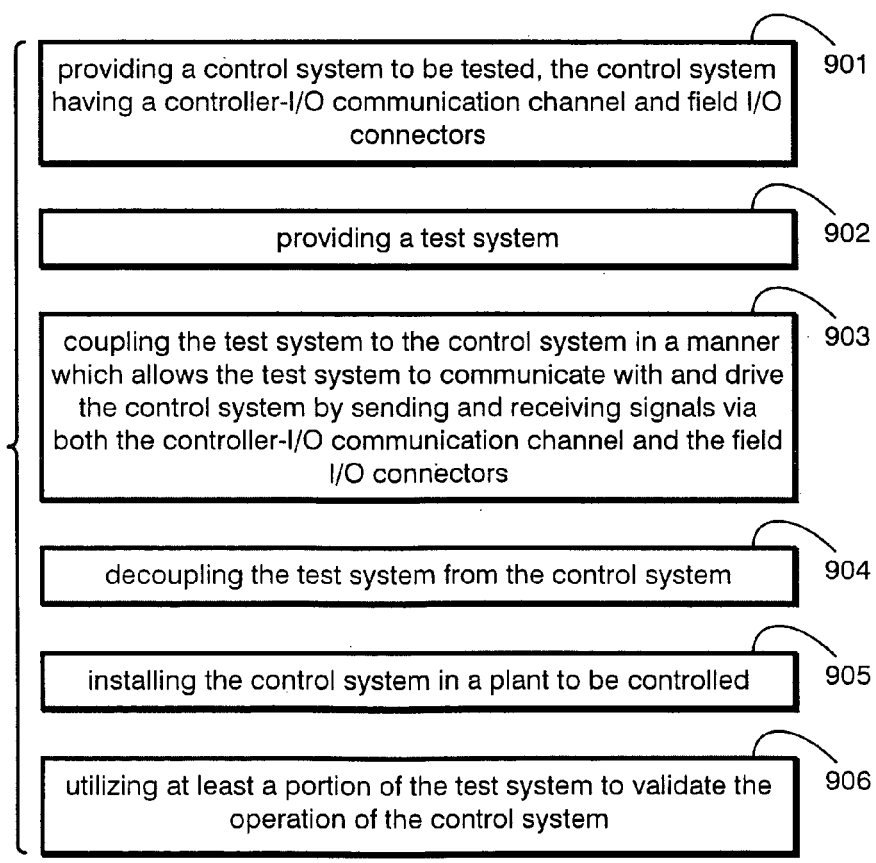
FIG. 20 is a diagram of a second method embodying the invention.
Figure 21:
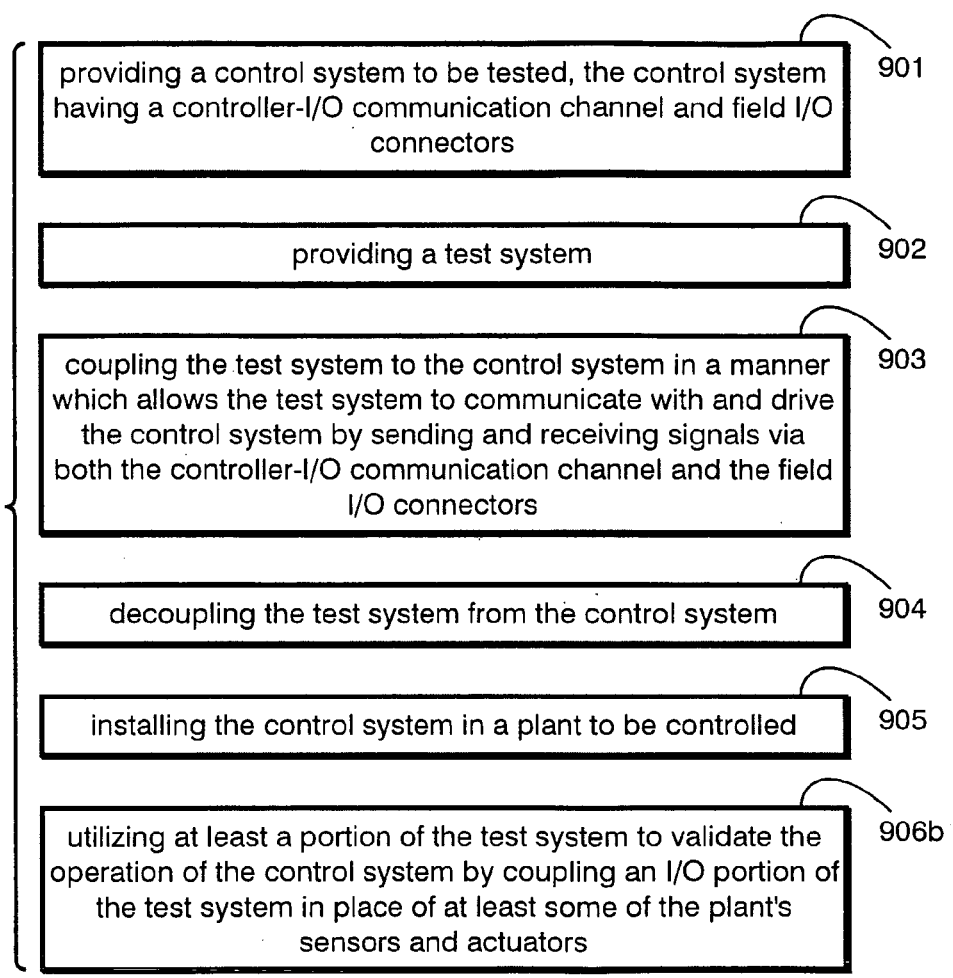
FIG. 21 is a diagram of a third method embodying the invention.
Figure 22:
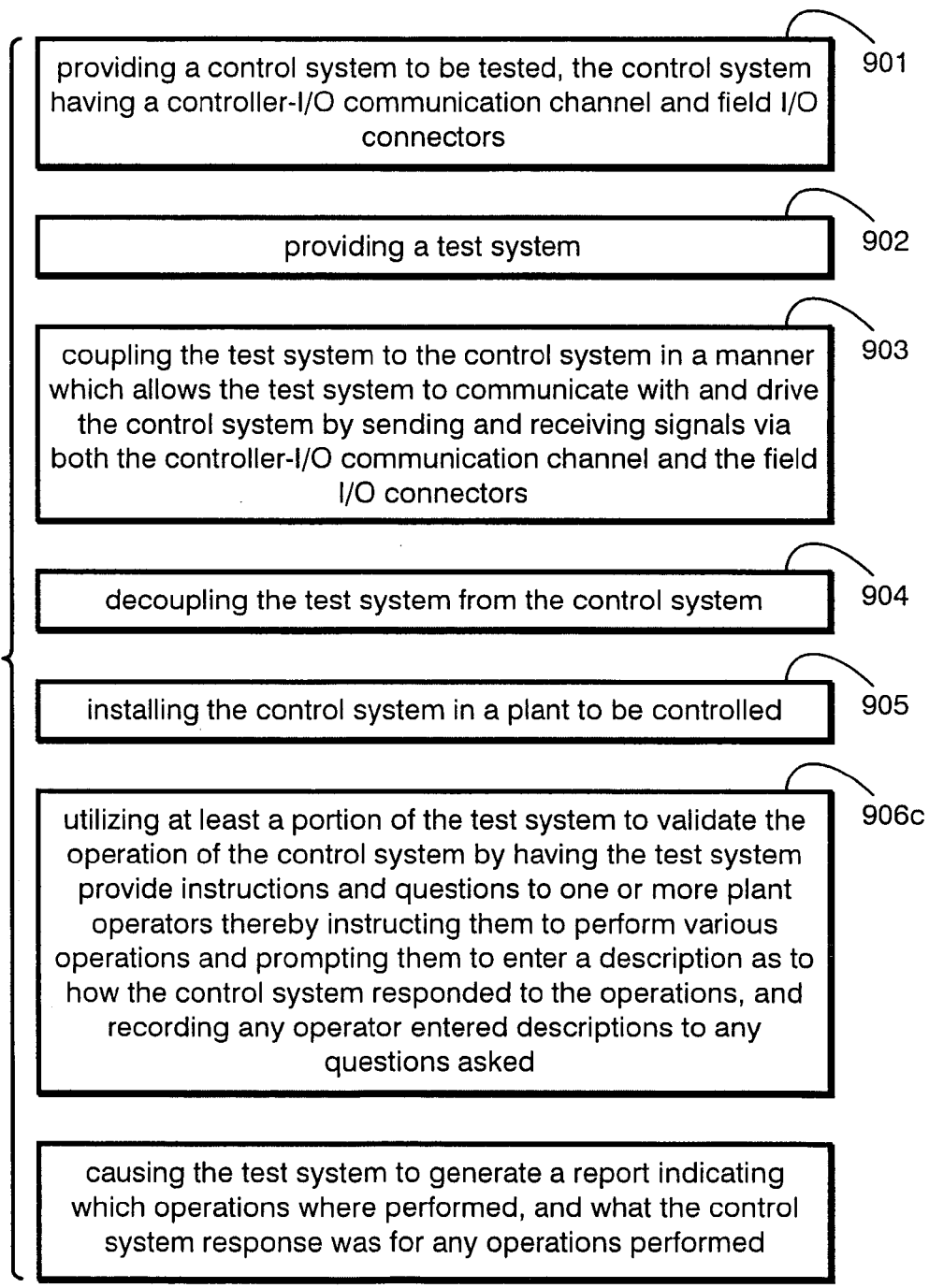
FIG. 22 is a diagram of a fourth method embodying the invention.
Figure 24:
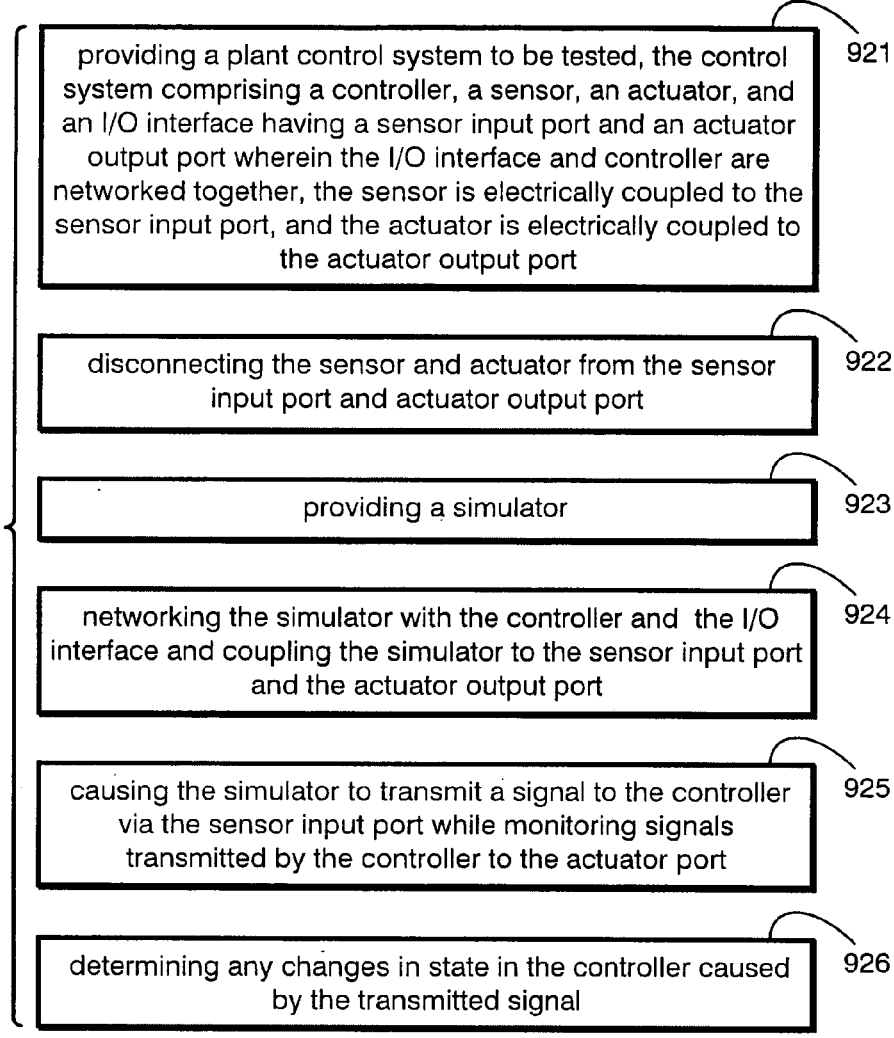
FIG. 24 is a diagram of a sixth method embodying the invention.
Figure 25:
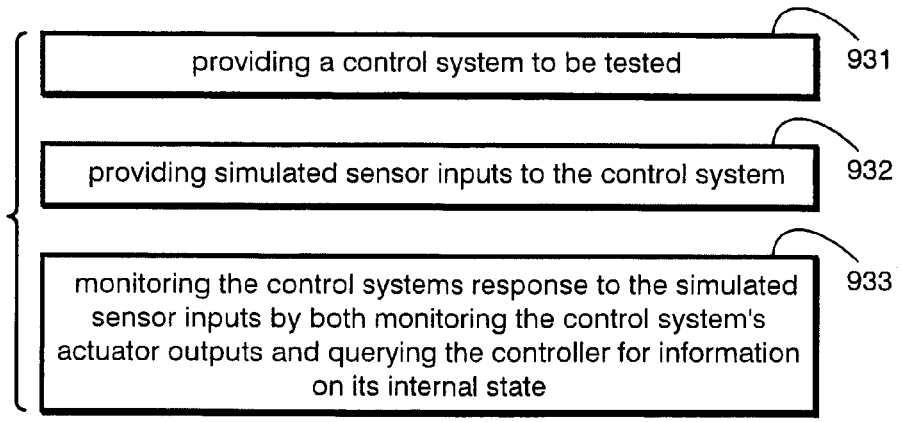
FIG. 25 is a diagram of a seventh method embodying the invention.

FIGS. 12–18 show some of the fields and data which might be included. The table of FIG. 12 is an "Alarm" table and includes, possibly among others, the fields TagName, Initial, LL_Limit, L_Limit, H_Limit, HH_Limit, and Deadband. The table of FIG. 13 is an "Alarm G" table and includes, possibly among others, the fields Alm_Ind, QNum, Type, and Question. The table of FIG. 14 is an "Indication" table and includes, possibly among others, the fields ID, TagName, Description, EUZero, EUMax, and Eunit. The table of FIG. 15 is an "PID Loop" table and includes, possibly among others, the fields PID_Number, Loop_Desc, Process_TagName, Min_EU, Max_EU, and EU_Name_SetPoint_TagName. The table of FIG. 16 is an "Section IQ" table and includes, possibly among others, the fields ID, SectionNum, SectionStep, and Instruction. The table of FIG. 17 is a "Section List" table and includes, possibly among others, the fields Num and Name. The table of FIG. 18 is an "SysReqs" table and includes, possibly among others, the fields ID, Section, Requirement, and Question.

SIMCart 10 is contemplated as being particularly well suited for a number of uses when taken to an operational facility and connected in place of all or part of the field wiring including but not necessarily limited to: (1) testing existing logic for reaction to new scenarios; (2) testing new logic for operations; (3) training process operators prior to an operational campaign to a) score and validate operator readiness, b) identify deficient training areas, and c) ensure operational readiness as an overall team; (4) training process operators at the operational facility using by plugging SIMCart 10 in in place of the plant's actual sensors and actuators; (4) field trouble shooting of wiring and other field related problems.

FIRST EXAMPLE APPLICATION

An example application of SIMCart 10 is its in revalidating a PLC program used to manufacture a drug wherein the PLC does so by controlling ingredient weighing, heating, cooling, tank level control, pump control, and other portions of the manufacturing process. This example refers to target CS 20 as if it were the system to be re-validated. Revalidation of the PLC program of target CS 20 would involve first using the SIMCart 10 to perform off-site testing of target CS 20, and then detaching the HMI/Configurator from the rest of SIMCart 10 and taking it on-site in the field with target CS 20 when target CS 20 is installed at the drug production facility.

During off-site/lab testing, I/O simulation modules 120 are used to provide an input to each of the PLC I/O channels via field I/O connectors 225. The SIMCart automatic initialization routines create a mapping between the target PLC and SIMCart I/O channels. A tester would log into the SIMCart configurator computer/HMI 130 (requiring operators to log in facilitates future auditing). After logging in, test databases are downloaded from a requirements database that was established for target CS 20 at the project start. The test databases are then used to test all functions of the PLC, HMI and network including alarms, loops, and field wiring to satisfy the testing requirement contained in the test databases. Such testing is accomplished via a series of automatic tests, as well as tests which prompt the operator to perform certain actions and to provide responses/inputs to the HMI after performing such actions. The testing of alarms includes the testing of deadbands, and appropriate low—low, low, high, and high—high alarm ranges as well as other types of data deltas. All data can be stored electronically with a date and time stamp as well as with other audit information as necessary.

Once off-site/lab testing is complete, the SIMCart configurator/HMI 130 is datached from the SIMCart and target CS 20 and taken to the field to be used onsite to test target CS 20 once it is installed in the drug production facility. In the field, the SIMCart configurator provides a field tester with a series of tests related to field I/O and wiring connections. For some tests, the field tester is prompted by the SIMCart configurator to instruct a technician, possibly via cell-phone, to input signals to the system which will be passed to target CS 20 via the field wiring. The SIMCart configurator 130 then prompts the field tester to enter responses answering questions related to the feedback HMI 230 of target CS 20 provided to the tester in response to the technician's inputs. All test questions and results are stored so as to allow a report of test results to be generated.

SECOND EXAMPLE APPLICATION

Once test target CS 20 is installed in the drug production facility, SIMCart 10 can periodically be used to train process operators. Such training can be done on site, using the target CS 20 HMI by simply disconnecting target CS 20 from the plant's sensors and actuators, probably by disconnecting the field wiring, and connecting SIMCart 10 to target CS 20 in place of the sensors and actuators. Once target CS 20 is operating with simulated I/O rather than live sensors and actuators, operators are free to interact with target CS 20 without any fear of consequences to the plant. When used in such a manner, the test procedures used to validate target CS 20 may be used in training operators, or else SIMCart 20 may incorporate specific software and/or data for training operators. Such software and/or data may incorporate multimedia presentations such as training videos. SIMCart 20 may also work partially or completely independently of the operator so as to simulate events, track operator responses to the simulated events, and/or report on the quality of the operator's responses, without the operator having to interact with SIMCart 20 during training.

Thus, specific embodiments and applications of devices and methods for plant control system testing have been disclosed. It should be apparent, however, to those skilled in the art that many more modifications besides those already described (including the methods shown in FIGS. 8–15) are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for testing a plant control system having a controller, a sensor input port, an actuator output port, a series of communication segments communicatively coupling the sensor input port to the controller such that an input signal applied to the sensor input results in one or more signals traveling along each of the communication segments so as to notify the controller of the applied input signal, and a series of communication segments communicatively coupling the controller to the actuator output port such that a control signal generated by the controller results in an output signal being applied to the actuator output port, the method comprising:

providing a simulator and coupling the simulator to the control system at at least three points, wherein a first point is the sensor input port, a second point is a point from which data relating to the internal state of the controller are obtained, and a third point is the actuator output port;

causing the simulator to apply a signal to the first point and to subsequently obtain data on the internal state of the controller from the second point and to monitor the actuator output port using the third point for any applied signals; and wherein the plant control system is at least in part disconnected from a plant that is to be controlled by the control system during testing the plant control system.

2. The method of claim 1 with the control system further comprising an I/O interface wherein coupling the simulator to the control system at the second point involves tying the simulator into a network used as a communication segment between the controller and the I/O interface.

3. The method of claim 2 wherein the I/O interface comprises at least two analog/digital converters with a first, input converter converting an analog input signal applied to the sensor input by the simulator or sensor into a digital signal which is transmitted to the controller; and a second, output converter converting a digital signal received by the I/O interface from the controller into an analog signal which is transmitted to the simulator or actuator.

4. The method of claim 3 wherein the simulator obtains data on the internal state of the controller by establishing a network connection with the controller and requesting that the controller report its internal state.

5. The method of claim 1 wherein the plant control system is located off-site relative to the plant that is controlled by the plant control system.

* * * * *